(12) United States Patent
Rodriguez

(10) Patent No.: US 7,545,208 B2
(45) Date of Patent: Jun. 9, 2009

(54) SIGNAL AMPLIFICATION THROUGH AN ELECTROMAGNETIC DEVICE

(76) Inventor: Manuel De Jesus Rodriguez, 8234 Wynne Ave., Reseda, CA (US) 91335

( * ) Notice: Subject to any disclaimer, the term of this patent is extended or adjusted under 35 U.S.C. 154(b) by 481 days.

(21) Appl. No.: 11/273,367

(22) Filed: Nov. 12, 2005

(65) Prior Publication Data
US 2007/0109054 A1 May 17, 2007

(51) Int. Cl.
*H03F 9/00* (2006.01)
(52) U.S. Cl. .................. 330/58; 330/63; 330/207 R; 322/28
(58) Field of Classification Search ............ 330/207 R, 330/58, 63; 322/28
See application file for complete search history.

(56) References Cited

U.S. PATENT DOCUMENTS

| | | | |
|---|---|---|---|
| 2,710,941 A * | 6/1955 | Bonnell | 323/348 |
| 4,047,120 A | 9/1977 | Lord et al. | 330/207 P |
| 4,409,559 A | 10/1983 | Amada et al. | 330/295 |
| 4,453,131 A | 6/1984 | Paullus | 330/97 |
| 4,517,522 A | 5/1985 | Furrer | 330/10 |
| 4,651,112 A | 3/1987 | Keysor | 330/297 |
| 4,763,080 A | 8/1988 | Gulczynski | 330/10 |
| 5,986,498 A | 11/1999 | Rodriguez | 330/10 |
| 6,294,902 B1 | 9/2001 | Moreland et al. | 323/268 |
| 6,392,476 B1 | 5/2002 | Rodriguez | 330/10 |
| 6,489,839 B2 | 12/2002 | Maaskant et al. | 330/10 |
| 6,492,868 B2 | 12/2002 | Kirn | 330/10 |
| 6,566,963 B1 | 5/2003 | Yan et al. | 330/311 |
| 6,615,025 B1 | 9/2003 | Lee | 455/72 |
| 6,844,777 B2 | 1/2005 | Kitamura | 330/10 |
| 6,882,222 B2 | 4/2005 | Honda et al. | 330/207 A |
| 6,919,771 B2 | 7/2005 | Nakajima | 332/109 |
| 6,922,101 B2 | 7/2005 | Bayko | 330/10 |
| 2001/0043055 A1 * | 11/2001 | Tanaka et al. | 322/28 |

* cited by examiner

*Primary Examiner*—Michael B Shingleton
(74) *Attorney, Agent, or Firm*—Peter Ganjian

(57) ABSTRACT

The present invention uses an electromagnetic device for amplifying an input signal without the use of amplifiers, power supplies, and inverter/converter circuits. The present invention routes an input signal through an electromagnetic device for amplification of the input signal for later use by various loads.

31 Claims, 12 Drawing Sheets

SIGNAL AMPLIFICATION THROUGH AN ELECTROMAGNETIC DEVICE

BACKGROUND OF THE INVENTION (1) Field of the Invention

This invention relates to signal processing through an electromagnetic device and, in particular, to system and method for signal amplification via the electromagnetic device without the use of power amplifiers, separate power supplies, and power inverters.

(2) Description of Related Art

Amplifying circuits are well known in the prior art and generally require a power amplifying stage. Such power amplifier circuits are illustrated in U.S. Pat. Nos. 4,409,559 and 4,651,112.

A typical class AB amplifier includes a power supply and an amplifier, both of which significantly increase manufacturing costs. Prior art circuits that avoid the requirement of a power amplifier are disclosed in the U.S. Pat. Nos. 4,763,080; 4,517,522; 4,047,120; and 4,453,131. Other conventional amplifiers such as the class D amplifiers always switch at fifty percent duty cycle even without application of any signal, which causes an inherent noise that increases the signal-to-noise ratio of a circuit. A more recently developed system that produces direct audio from a power supply is disclosed in the U.S. Pat. Nos. 5,986,498 and 6,392,476. The U.S. Pat. Nos. 5,986,498 and 6,392,476 relate to an off-line direct audio circuit that use a power supply and do not require a power amplifier output stage.

Regrettably, most conventional amplifying methods and devices use a dedicated power supply and power inverter circuits for the amplification of input signals, even if they avoid the use of power amplifier output stage. Therefore, it would be advantageous to have a highly efficient and effective circuit for amplifying input signals but without the requirement of having an expensive power amplifier stage, separate power supply, and power converters/inverters.

BRIEF SUMMARY OF THE INVENTION

The present invention uses an electromagnetic device (such as an alternator) that may be powered mechanically for amplifying an input signal without the use of amplifiers, power supplies, and inverter/converter circuits. The present invention routes an input signal through an electromagnetic device for amplification of the input signal for later use by various loads.

One aspect of the present invention provides a method for signal amplification, comprising the acts of:
  receiving a main input signal;
  comparing the main input signal with output feedback signals, and outputting a system input signal;
  modulating the system input signal for outputting a modulated signal;
  coupling the modulated signal with a magnetic field generator winding of an electromagnetic device for generating a modulated magnetic field, which induces modulated electrical signals onto one or more electrical signal generator windings of the electromagnetic device;
  rotating the electromagnetic device for amplifying the induced modulated electrical signals for outputting first amplified signals;
  detecting polarity of the main input signal;
  rectifying the first amplified signals in accordance with the detected polarity of the main input signal for output of second amplified signals;
  recovering a main output signal by removing a modulated component of the second amplified signals for deriving a load and for providing feedback signal as the output feedback signals to a feedback circuitry.

Another optional aspect of the present invention provides a method for signal amplification, wherein:
  the act of receiving a main input signal is further comprised of an act of comparing the main input signal with the output feedback signals for detection and correction of overall system signal processes.

Yet another optional aspect of the present invention provides a method for signal amplification, wherein:
  the act of modulating the system input signal is further comprised of full wave rectifying and modulating the system input signal.

Still another optional aspect of the present invention provides a method for signal amplification, wherein:
  the act of coupling the modulated signal with the magnetic field generator winding of the electromagnetic device is further comprised of providing a modulating switch.

A further optional aspect of the present invention provides a method for signal amplification, wherein:
  the act of detecting the polarity of the main input signal is further comprised of providing a polarity detector for determining the polarity of the main input signal.

Yet a further optional aspect of the present invention provides a method for signal amplification, wherein:
  the act of rectifying the first amplified signals from a one or more electrical signal generator windings of the electromagnetic device in accordance with the detected polarity of the main input signal is comprised of:
  rectifying the first amplified signals from the one or more electrical signal generator windings when a detected polarity of the main input signal is negative;
  rectifying the first amplified signals from the one or more electrical signal generator windings when the detected polarity of the main input signal is positive.

Still a further optional aspect of the present invention provides a method for signal amplification, wherein:
  the act of recovering a main output signal for deriving the load is comprised of an act of demodulating the second amplified signals for removal of a modulation component.

Another optional aspect of the present invention provides a method for signal amplification, wherein:
  the act of demodulating is comprised of filtering the modulation component of the second amplified signals through a low pass filter for output of the main output signal for the load.

Yet another optional aspect of the present invention provides a method for signal amplification, wherein:
  the act of providing a feedback signal is comprised of providing output feedback signals for controlling the electrical parameters of the main output signal.

Another aspect of the present invention provides a system for signal amplification, comprising:
  a main input signal coupled with a signal comparator circuit, with the signal comparator circuit producing a system input signal;
  a modulator circuit for modulating the system input signal for generating a modulated signal;
  an electromagnetic device having a magnetic field generator winding, with the modulated signal coupled with the magnetic field generator winding for generating a magnetic field, which induces modulated electrical signals onto one or more electrical signal generator windings of the electromagnetic device;

a mechanical energy generator for rotating the electromagnetic device for amplifying the induced modulated electrical signals for outputting first amplified signals;

a polarity detector circuit coupled with a comparator circuit for detecting the polarity of the main input signal;

a set of rectifying circuits for rectifying the first amplified signals in accordance with the detected polarity of the main input signal for outputting rectified signals;

a recovery circuit for filtering a high frequency component of the rectified signals for outputting a main output signal for deriving a load; and a feedback circuitry for correction of the main output signal in relation to the input signal.

Another optional aspect of the present invention provides a system for signal amplification, wherein:

the signal comparator circuit is comprised of a comparator amplifier with an output coupled with a low-pass filter comprised of a resistor and a capacitor combination, which loop and feedback the system input signal to a negative input of the signal comparator circuit for controlling a bandwidth of the main output signal, and facilitating a control for a phase gain of system input signal.

Yet another optional aspect of the present invention provides a system for signal amplification, wherein:

the modulating circuit is comprised of a precision full wave rectifier coupled with a modulator for deriving a buffer switch for buffering and outputting the modulated signal that is coupled with the electromagnetic device.

Still another optional aspect of the present invention provides a system for signal amplification, wherein:

the buffer switch is comprised of a N channel MOSFET having a gate electrode coupled with the modulator, a source electrode coupled with a ground, and a drain electrode coupled with the electromagnetic device.

A further optional aspect of the present invention provides a system for signal amplification, wherein:

a high impedance field bias resistor is coupled with the magnetic field generator winding at one end, and a ground at other end for biasing the set of rectifier circuits.

Yet a further optional aspect of the present invention provides a system for signal amplification, wherein:

the polarity detector is comprised of an amplifier that functions as a linear signal amplifier with a controlled gain for a first input level signal for reducing possible crossover distortions, and functions as a switching amplifier for a second input level signal.

Still a further optional aspect of the present invention provides a system for signal amplification, wherein:

a biasing scheme coupled with a first buffer-deriver and a second buffer-deriver for deriving and gating a first transistor and a second transistor that are coupled with the set of rectifier circuits, in accordance with a detected polarity of the system input signal by the polarity detector.

Another optional aspect of the present invention provides a system for signal amplification, wherein:

the first transistor directing the set of rectifier circuits to rectify in one of a positive and negative polarity; and the second transistor directing the set of rectifier circuits to rectify in opposite polarity to that directed by the first transistor.

Yet another optional aspect of the present invention provides a system for signal amplification, wherein:

the recovery circuit is comprised of a filter-demodulator that is comprised of an inductor coupled with a capacitor for forming a second order filter.

Still another optional aspect of the present invention provides a system for signal amplification, wherein:

the feedback circuit is comprised of a phase lag compensation to modify phases of the main output signal in relation to that of the rectified signal for avoiding oscillations.

A further optional aspect of the present invention provides a system for signal amplification, wherein:

one or more parameters of the main input signal is varied by external systems before the main input signal is coupled with the signal comparator circuit.

Still a further optional aspect of the present invention provides a system for signal amplification, wherein:

the external system is comprised of a programmable voltage regulator for deriving the load;

the programmable voltage regulator is comprised of:

a positive, negative, and neutral voltage references;

a first switching system having one end coupled with one of the positive, negative, and neutral voltage references for selecting one of the positive, negative, and neutral voltage references based on load requirements;

a variable impedance circuit coupled with the first switching system for varying one or more electrical parameters of the voltage references for outputting one of a positive, negative, and neutral variable signal as the main input signal;

a second switching system for disabling supply of the main input signal; and a protection circuit having one end coupled with a second end of the first switching system, and another end coupled with the variable impedance circuit, with the protection circuit providing sufficient impedance to prevent the flow of the main input signal back to the voltage references when the second switching system is actuated for disabling supply of the main input signal.

Yet a further optional aspect of the present invention provides a system for signal amplification, wherein:

the variable impedance circuit is coupled with an acceleration unit of a transportation system.

Another optional aspect of the present invention provides a system for signal amplification, wherein:

the second switching system is coupled with a deceleration unit of a transportation system.

Yet another optional aspect of the present invention provides a system for signal amplification, wherein:

the load is comprised of a drive unit for a transportation system.

Still another optional aspect of the present invention provides a system for signal amplification, wherein:

the load is a direct current load.

A further optional aspect of the present invention provides a system for signal amplification, wherein:

the external system is comprised of a programmable voltage regulator for deriving the load;

the programmable voltage regulator is comprised of:

an Alternative Current voltage source for generating an AC voltage reference;

a variable impedance circuit coupled with the Alternative Current voltage source for varying one or more electrical parameters of the AC voltage reference for outputting a variable signal as the main input signal;

a switching system for disabling supply of the main input signal; and a protection circuit having one end coupled with the Alternative Current voltage source, and another end coupled with the variable impedance circuit, with the protection circuit providing sufficient impedance to prevent the flow of the main input signal back to the AC voltage reference when the switching system is actuated for disabling supply of the main input signal.

Yet another optional aspect of the present invention provides a system for signal amplification, wherein:

the switching system is coupled with a deceleration unit of a transportation system.

Still a further Another optional aspect of the present invention provides a system for signal amplification, wherein:

the load is an Alternative Current load.

Another optional aspect of the present invention provides a system for signal amplification, wherein:

the external system is comprised of a variable impedance circuit coupled with a deceleration unit of a transportation system;

the variable impedance circuit generating a variable voltage reference as the main input signal when the deceleration unit is actuated.

Yet another optional aspect of the present invention provides a system for signal amplification, wherein:

the external system is comprised of a variable impedance circuit coupled with an acceleration unit of a transportation system;

the variable impedance circuit generating a variable voltage reference as the main input signal when the acceleration unit is actuated.

A further optional aspect of the present invention provides a system for signal amplification, wherein:

the acceleration unit further includes an auto-derive system for the transportation system.

These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

Figure 1:
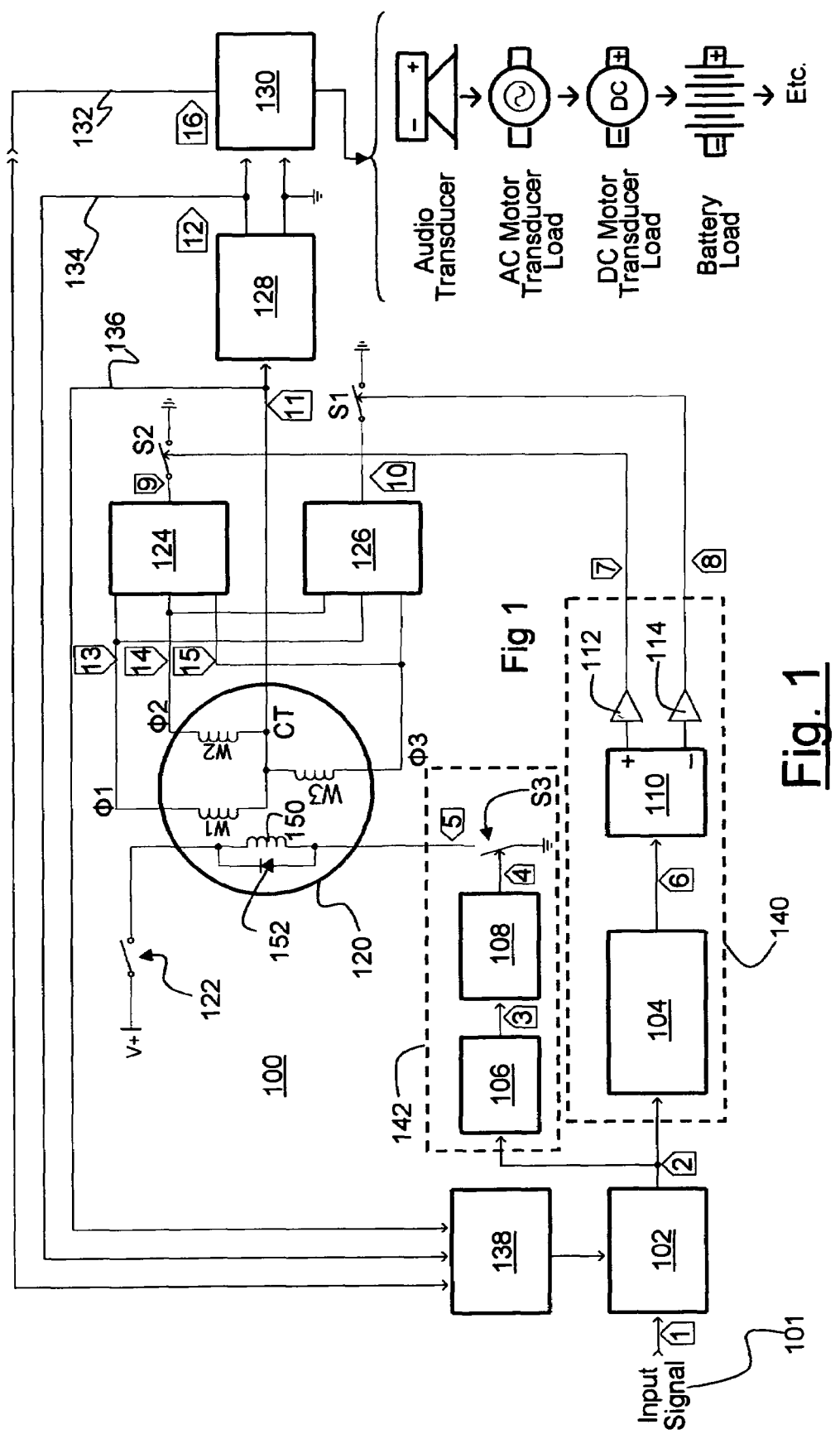
FIG. 1 is an exemplary block diagram illustration of a signal amplifying circuit in accordance with the present invention.
Figure 2:
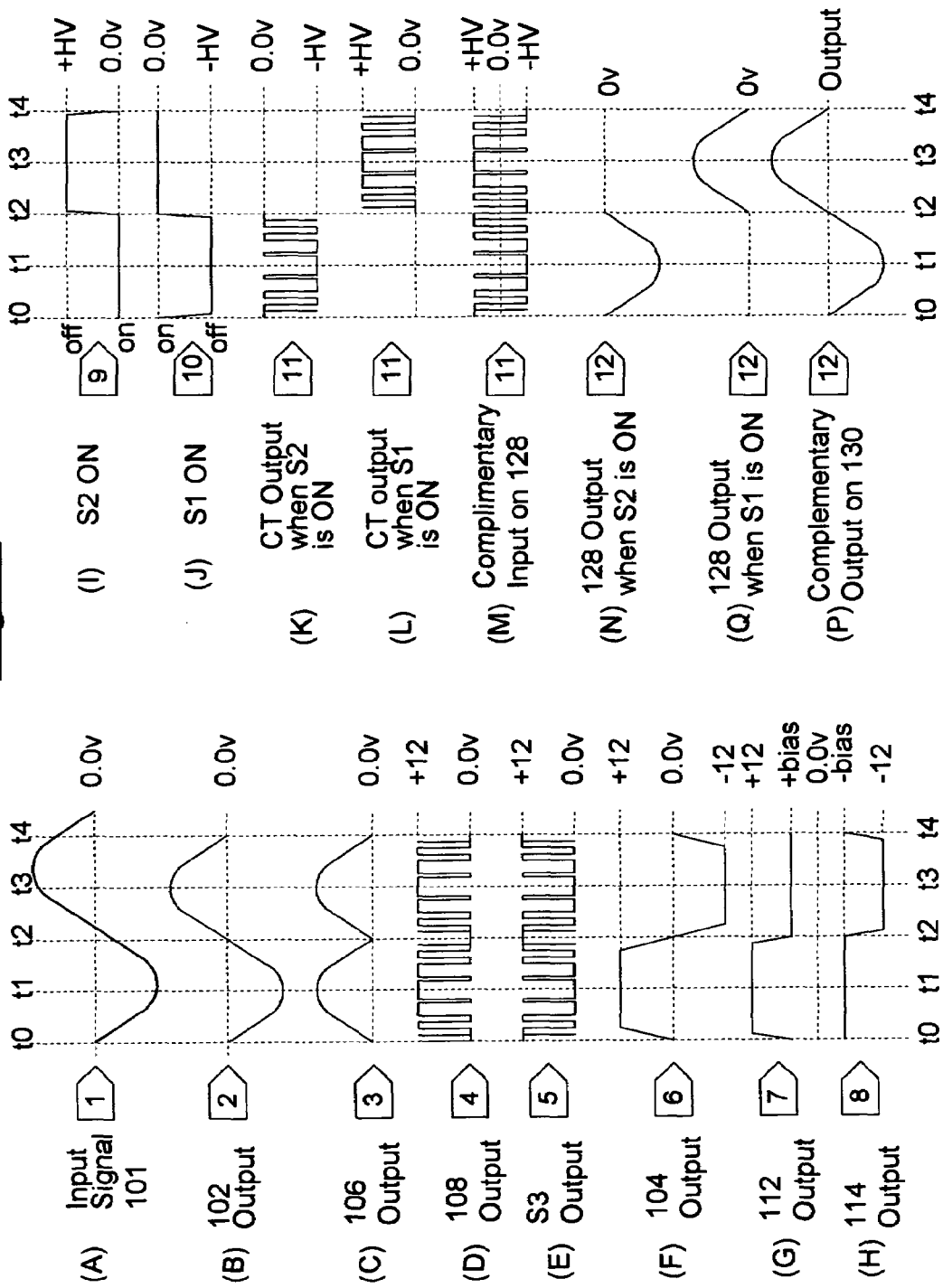
FIG. 2 is an exemplary graphical illustration of waveforms representing various signals within the signal amplifying circuit in accordance with the present invention.

FIG. 1 is an exemplary block diagram illustration of a signal amplifying system 100 in accordance with the present invention, and FIGS. 2(A) to 2(P) are waveform diagrams illustrating the various waveforms at particular points in the circuit of FIG. 1. The signal amplifying system 100 of the present invention uses an electromagnetic device 120 for amplifying an input signal 101 for deriving a load 130, thereby avoiding the use of amplifiers, power supplies, and inverter/converter circuits. A non-limiting example of an electromagnetic device 120 that may be used within the signal amplifying system 100 of the present invention may include a conventional alternator. Alternators are well-known devices that convert mechanical energy into electrical energy.

As illustrated in FIG. 1, a main input signal 101 indicated at point 1 and illustrated in FIG. 2(A) is coupled with the circuit 100 to derive a load 130 via a signal comparator circuit 102, with an output signal that is defined as the system input signal indicated at point 2, and illustrated in FIG. 2(B). The signal comparator circuit 102 functions to compare the overall system feedback signals from the feedback circuitry 138 to that of the main input signal 101 to maintain the required system input signal at point 2 for the overall operation of the circuit 100. The signal comparator circuit 102 may adjust the main input signal 101 by varying its amplitude, waveform distortion, phase, and other electrical characteristics based on the overall system performance determined by the comparison of the output feedback signals from the feedback circuitry 138 with that of the main input signal 101.

The system input signal that is output from the signal comparator circuit 102 at point 2 and illustrated in FIG. 2(B) is coupled with a modulator circuitry 142 and a polarity bias and gate deriver circuitry 140. The modulator circuitry 142 rectifies the system input signal at point 2 by a precision full wave rectifier 106, and outputs the rectified input signal at point 3, the waveform of which is illustrated in FIG. 2(C). The full wave rectification of the system input signal at point 2 to have only positive components is needed because modulator 108 can only modulate positive components of a signal. Hence, as illustrated in FIG. 2(C), after rectification of signal at point 2 the negative component of the system input signal at point 2 is shifted to positive. Therefore, the signal at point 2 is rectified to a waveform illustrated in FIG. 2(C) with only positive components, ready for input into the modulator 108. This will allow both the positive and the negative levels of the signal at point 2 to be modulated.

Precision full wave rectification provides a more accurate rectification of the system input signal at point 2, which enable attenuation of distortions that may occur if regular diodes were to be used as rectifier elements. That is, with regular rectifiers the smallest value of rectification is at the value for which the regular rectifiers using regular diodes operate, which is generally known to be about 0.7 V. The precision full wave rectifiers operate to allow rectification of values less than 0.7 V, generally in the mV range, which is a more accurate rectification of a signal, and therefore, resulting in less distortion. However, although regular rectifiers may be used, nonetheless, precision rectifiers are preferable.

The modulator circuitry 142 further includes a modulator 108 for modulating the precision rectified system input signal at point 3, resulting in a modulated output signal at point 4, which is shown in the illustrated waveform in FIG. 2(D). Modulator 108 may be comprised of most well-known modulators, non-limiting examples of which may include direct-voltage modulators, self-oscillating modulators, frequency modulators, phase shift modulators, resonant modulators, analog modulators, pulse-width modulators, etc.

The modulated signal at point 4 is coupled with a modulator buffer switch S3 that buffers and outputs a modulated signal at point 5, illustrated in FIG. 2(E). The modulated signal at 5 is coupled with a magnetic field generator winding 150 of the electromagnetic device 120, which produces a magnetic field based on the signal at point 5. Hence, the signal at point 5 controls the magnetic field of the electromagnetic device 120. The modulated signal at point 5 is a high frequency signal that functions as a "carrier" of information related to the main input signal 101, and is amplified by the electromagnetic device 120. The electromagnetic field generated as a result of the modulated signal at point 5 passing through the magnetic field generator winding 150, along with the mechanical spin of the electromagnetic device 120, induces an amplified voltage into one or more electrical signal generator windings W1, W2, and W3. The one or more electrical signal generator windings W1, W2, and W3 generate high voltage and high current modulated switching output signals at the respective points 13, 14, and 15. That is, the electromagnetic device 120 transforms modulated magnetic filed into a high voltage output from the induced magnetic field onto the one or more electrical signal generator windings W1, W2, and W3 by means of field rotation of the electromagnetic device 120, achieved by the mechanical motion. The strength of amplification of the signal at point 5 by the electromagnetic device 120 at the respective output points 13, 14, and 15 depends on the strength of the magnetic field generated by the magnetic field generator winding 150. The strength of the magnetic field generated by the magnetic field generator winding 150 depends on the strength of the mechanical force (rotation) applied to the electromagnetic device 120.

As described above, the electromagnetic device 120 may be an alternator, which converts mechanical energy (rotation) to electrical energy. Hence, the greater the mechanical force (spin) applied to the electromagnetic device 120 (faster rotation of the alternator), the greater the electrical energy (higher voltage—higher current) produced at the windings W1, W2, and W3. Accordingly, a faster rotation of the electromagnetic device 120 will produce a greater magnetic field based on the modulated signal at point 5 coupled with the magnetic field generator winding 150. The amplified magnetic field generated based on the modulated signal at point 5 is then induced on each phase φ1, φ2, and φ3 of the respective electrical signal generator windings W1, W2, and W3 to produce electrically amplified signals at the respective points 13, 14, and 15. The greater the magnetic filed (resulting from a faster spin of the electromagnetic device 120), the greater the electrical energy produced by each phase φ1, φ2, and φ3 of the respective electrical signal generator windings W1, W2, and W3. Hence, the size of the amplification of the modulated carrier signals at point 5 coupled with the electromagnetic device 120 is commensurate with the amount of electrical energy produced by the electromagnetic device 120.

Although the electrical signal generator windings W1, W2, and W3 are illustrated to be connected in multi-phase mode in a Y configuration, a Delta—Δ configuration may also be used with obvious modification. Each of the electrical signal generator windings W1, W2, and W3 generate a three-phase φ1, φ2, and φ3 electrical signal output with respect to the center tap CT, the waveform of which is illustrated in FIG. 2(M). The outputs 13, 14, and 15 of the respective phases φ1, φ2, and φ3 are then coupled with a pair of output full-wave power rectifiers 124 and 126.

The mechanical energy needed to rotate the electromagnetic device 120 to produce electrical energy may come from any number of sources, non-limiting examples of which may include the mechanical motion of a generator or an engine used in vehicles, such as cars, planes, boats, and so on. If the signal amplifying system 100 is used in cars, then an initial activation switch 122 (e.g., an ignition switch) may be used to connect a car battery B+ to an ignition to crank and start the mechanical motion of the engine of the car, which can then be used to rotate the electromagnetic device 120. Accordingly, the battery and the initial activation switch 122 are optional, and are merely illustrated as an example to show the use of the signal amplifying system 100 in a car environment.

As further illustrated in FIG. 1, the system input signal at point 2 (FIG. 2(B)) is also coupled with the polarity bias and gate deriver circuitry 140. The polarity bias and gate deriver circuitry 140 is comprised of a polarity detector 104 that detects the polarity of the system input signal at point 2, deriving a pair of switches S1 and S2 commensurate with the polarity of the system input signal at point 2, the reason for which is described below. At low input levels, the polarity detector circuit 104 functions as linear amplifier that slightly biases switches S1 and S2 to ON to avoid possible cross-over distortion created by the output full wave power rectifiers 124 and 126. At high input levels the polarity detector 104 functions as a switching amplifier, which turns ON or OFF either of the switches S1 or S2, depending on the detected polarity of the system input signal. In other words, at low signal levels the polarity detector 104 behaves as a linear amplifier to avoid cross-over distortions at low signal levels, and at high signal levels it behaves as a switching amplifier to achieve high efficiency at high output levels.

The polarity detector 104 deriving the switches S1 and S2 commensurate with the positive or negative cycle of the system input signal at point 2 (FIG. 2(B)) is required so that commensurate positive and negative pulses from the electromagnetic device 120 via the output full wave power rectifiers 124 and 126 can be recovered at point 11. The appropriate recovery (or matching) of the polarity of the output signal at point 12 (FIG. 2(P)) with that of the system input signal at point 2 (FIG. 2(B)) is needed for the correct operation of the load 130 (see FIG. 2(B) and FIG. 2(P)).

In other words, since there are positive pulse-width modulated signals and negative pulse-width modulated signals at points 13, 14, and 15 from the electromagnetic device 120, the output at point 11 must be gated so that at the proper time in accordance with the positive polarity of the system input signal at point 2 the positive pulses are transferred to the recovery circuit 128. Further, at another proper time in accordance with the negative polarity of the system input signal at point 2 the negative pulses are transferred to the recovery circuit 128.

Accordingly, since there are positive and negative output modulated pulses from the first and second output full-wave power rectifiers 124 and 126, the output signals at points 9 and 10 must be gated so that at the proper time the positive or the negative pulses are transferred to the recovery circuit 128 via the point at 11. In order to do that, the polarity detector circuit 104 produces signals at point 6 that are coupled through a biasing scheme 110 and a first buffer-deriver 112 and a second buffer-deriver 114 to derive and gate the respective transistors S2 and S1 in accordance with the detected polarity of the system input signal at point 2. These polarity detector signals at point 6 (FIG. 2(F)) gate either switch S1 or switch S2 (through the bias 110 and the respective second buffer-deriver 114 and first buffer-deriver 112) to enable signals with the proper polarity to be taken off the center tap CT at signal point 11. That is, the polarity detector 104 through the switches S1 and S2 therefore enables (or "programs") the first output full-wave power rectifier 124 to rectify a first polarity signal when switch S2 is ON (FIG. 2(K)), and the output full-wave power rectifier 126 to rectify a second, but opposite polarity signal when switch S1 is ON (FIG. 2(L)). The combined or cumulative output signal from both rectifiers 124 and 126 at point 11 is illustrated in FIG. 2(M). In other words, when S1 is ON, a first polarity rectification is obtained. Therefore, first polarity pulses are applied to the output recovery circuit 128 via CT; when S2 is ON, a second, opposite polarity rectification is obtained. Therefore, a second, opposite polarity pulses are applied to the recovery circuit 128 via CT. The polarity detector 104 may be thought of as a mechanism that keeps track of the polarity of the main input signal 101, regardless of any signal processing throughout the entire signal amplifying system 100. The polarity detector 104 may comprise of any number of well-known devices, non-limiting example of which may include a zero-crossing detector.

The output signal at point 11 (illustrated in FIGS. 2(K), 2(L), and 2(M)) is then input to the recovery circuit 128 for removal of the high frequency modulation component of the signal, and recovery of the now amplified system input signal, which is then applied to load 130. The recovery circuit 128 may comprise of a filter-demodulator, with the filter component being a low-pass filter. When the switch S1 is conducting, the first polarity pulses are demodulated and shown as the signal in FIG. 2(Q). When the switch S2 is conducting, the second, opposite polarity pulses are demodulated and are shown as the signal in FIG. 2(N). The composite signal that is applied to the load 130 is illustrated in FIG. 2(P). Hence, the recovery circuit 128 functions to remove the high switching frequency component of the modulated and amplified signal, leaving only the composite amplified output signal that now is coupled with the load, with no further amplification required.

The bias 110 of the polarity bias and gate deriver circuitry 140 functions to eliminate and correct cross-over distortions from the respective first and second output full-wave power rectifier 124 and 126 when the system input signal at point 2 nears and crosses the zero volts to switch polarity. The cross-over distortion corrections are needed because with regular rectifiers the smallest value of rectification is at the value for which the regular rectifiers using regular diodes operate, which is generally known to be about 0.7 V. Any value of the system input signal at point 2 below 0.7 V (which is generally the case when the system input signal nears or crosses the zero value) cannot be rectified. The system input signal at point 2 with values near the zero crossing that are below the operational parameters of the elements (e.g., diodes) of the rectifiers are in the "blind spot" of these rectifiers, where they are undetected and are not rectified, creating distortions. Therefore, a correction for this type of distortion is required, and is achieved by the bias 110. The first buffer-deriver 112 and the second buffer-deriver 114 are used to provide power to bias and gate the respective switches S2 and S1. They function as well-known voltage followers.

As further illustrated in FIG. 1, the signal amplifying system 100 of the present invention further includes a feedback circuitry 138 that is coupled with respective feedback lines 132, 134, and 136 to receive feedback from respective signals at respective points 16, 12, and 11. The feedback circuitry 138 improves overall system stability and maintains control over the output signals regardless of field rotation speed of the electromagnetic device 120. It should be noted that the output feedback may be connected directly to the transducer sensor terminal to avoid cable-wiring losses and provide better damping factors. Feedback signals from points 11 and 12 relate to the phase changes of these signals at the resonant frequency of the recovery circuit 128. The phase of a signal at point 11 changes by approximately 90° when it passes through the low-pass filter component of the recovery circuit 128, when the recovery circuit 128 operates at resonant frequency. Therefore, the phase of the output signal of the recovery circuit 128 at point 12 is different from the phase of the input signal to the recovery circuit 128 at point 11 at resonant frequency of the recovery circuit 128. However, this change in the phase of the signal at point 12 may not coincide with the phase in the input signal at point 1, which can create unwanted oscillation.

The feedback circuitry 138 includes a phase lag compensation to modify the phases of the output signal at point 12 in relation to that of the input signal at point 1 to avoid possible oscillations. This is accomplished by adjusting the respective phases to maintain the phase of the signal at point 12 completely in phase with that of signal at point 1. The feedback circuitry 138 of the present invention is further coupled with a remote feedback sensor signal at point 16 on line 132 to adjust and compensate for the amplitude of the main input signal 101 in accordance with the output signal at point 16. When the feedback signal at point 16 from the load 130 is such that its amplitude or the strength is too low, the feedback circuitry 138 detects this distortion, and compensates for it in conjunction with the comparator 102, by varying the strength of the main input signal 101.

The above described circuit topography requires no power-amplifier and no power supply, and therefore, has no power losses related to the power-amplifier and power supply. In addition, the manufacturing costs associated with the signal amplifying system 100 for amplification of signals is much lower than the traditional class D or class AB power amplifiers, including savings achieved by the fact that a power supply is no longer required.

Figure 3:
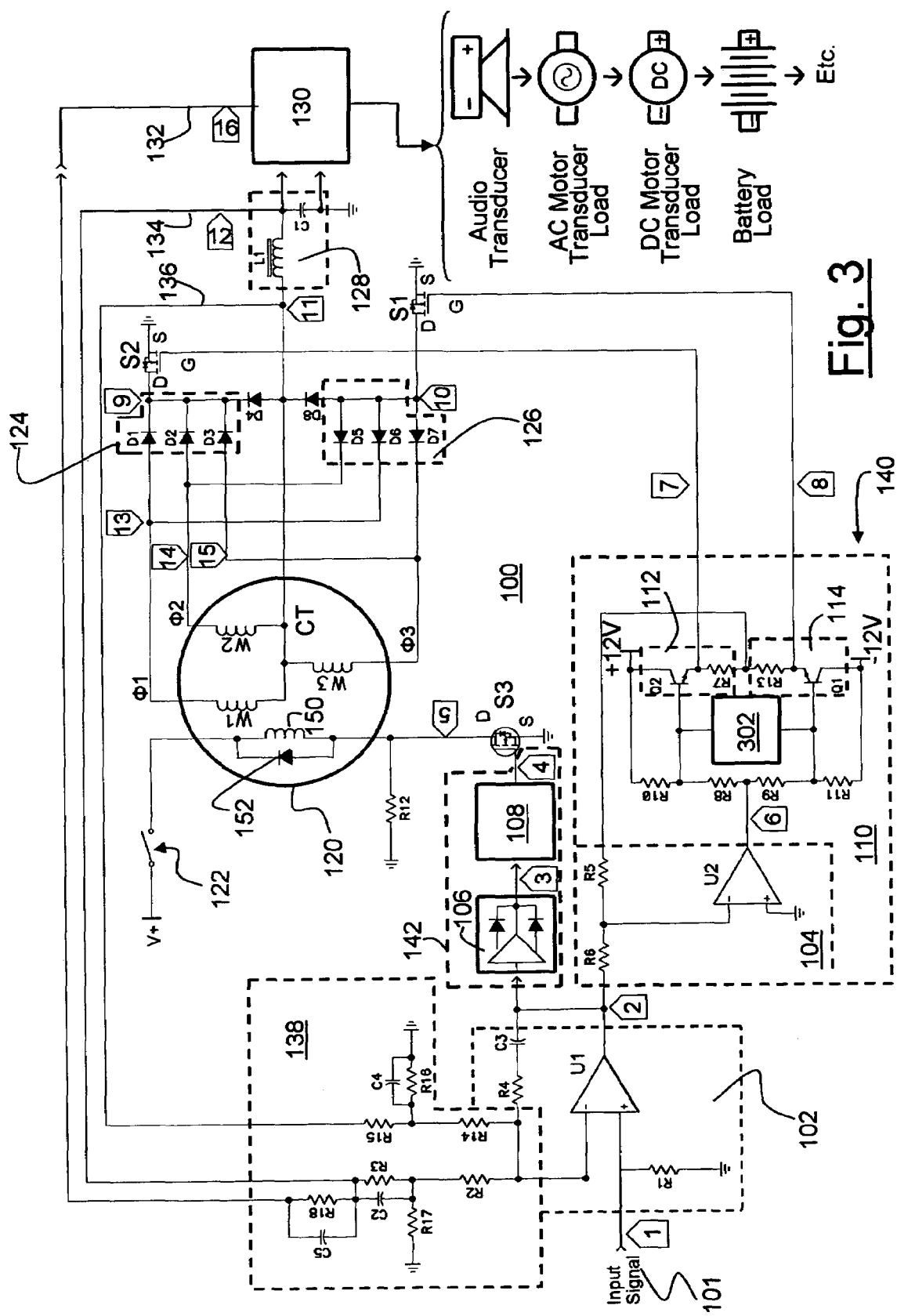
FIG. 3 is an exemplary block/schematic diagram illustration of the signal amplifying circuit of FIG. 1 in accordance with the present invention.

FIG. 3 is an exemplary block/schematic diagram illustration of the circuit of FIG. 1 in accordance with the present invention. As illustrated, the main input signal 101 indicated at point 1 is coupled with the circuit 100 to derive the load 130 via the signal comparator circuit 102, with an output signal that is defined as the system input signal indicated at point 2. In the present invention, the main input signal 101 is applied to the input of a comparator amplifier circuit U1, with a input impedance determined by the value of resistor R1, and a compensated phase shift feedback circuit, which determines the overall gain of the circuit and maintains stability. The comparator circuit 102 is generally coupled with resistors R3 and R17 that function as a voltage divider, which determine the overall amplitude gain of the system at the signal point 12, and are coupled with the negative input of a comparator amplifier unit U1 via resistor R2. As described above in relation to FIG. 1, the signal comparator circuit 102 may adjust the main input signal 101 by varying its amplitude, waveform distortion, phase, and other electrical characteristics based on the overall system performance determined by the comparison of the output feedback signals from the feedback circuitry 138 with that of the main input signal 101. The resistor R4 and capacitor C3 comprise a low-pass filter, which loop and feedback the system input signal at point 2 to the negative input of the signal comparator circuit 102. This low-pass filter controls the bandwidth of the output signal at point 2, and facilitates the control for the phase gain of the signal at point 2 to preferably be maintained at 0° phase.

The system input signal that is output from the signal comparator circuit 102 at point 2 is coupled with the modulator circuitry 142 and the polarity bias and gate deriver circuitry 140. The modulator circuitry 142 rectifies the system input signal at point 2 by well-known precision full wave rectifier 106, and outputs the rectified signal at point 3. The precision full wave rectifier is generally comprised of an operational amplifier with feedback diodes to provide a precision rectification of the system input signal at point 2. The modulator circuitry 142 further includes a well-known modulator circuit 108 for modulating the precision rectified system input signal at point 3, resulting in a modulated output signal at point 4. The modulated signal at point 4 is coupled with a gate electrode G of a N channel MOSFET modulator buffer switch S3 with the source electrode S of the switch S3 coupled with ground, and the drain electrode D coupled with the magnetic field generator winding 150 of the electromagnetic device 120.

As further illustrated in FIG. 3, a high impedance field bias resistor R12 is coupled at one end with the ground and at the other end with the magnetic field generator winding 150 of the electromagnetic device 120. The field bias resistor R12 is part of the overall biasing scheme of the entire signal amplifying system 100. During the initial operational phase of the signal amplifying system 100, the switch S3 is generally open, and the initial activation switch 122 is closed. During this initial phase, the current from an auxiliary source such as the Battery B+ passes through the magnetic field generator winding 150 to the ground through the high impedance field bias resistor R12. The small amount of current through the magnetic field generator winding 150 produces a minute magnetic field, which is induced on the one or more electrical signal generator windings W1, W2, and W3 to produce electrical signals through the windings, which then maintain a minimum, initial operational voltage across the rectifier diodes. In this exemplary case, the nominal initial operational voltage for the rectifiers 124 and 126 is 0.7 V. This way, using the field bias resistor R12, the signal amplifying system 100 maintains all the diodes D1 to D3 and D5 to D7 of the respective first and second output full-wave power rectifiers 124 and 126 in an ON biased condition, including the diodes D4 and D8 that are not part of the rectifiers.

During the actual operation of the circuit 100 (and not its initial phase), the switch S3 closes (is ON), generating and coupling the signal output at point 5 from the modulator buffer switch S3 to the magnetic field generator winding 150. The current of the modulated signal at point 5 passes through the magnetic field generator winding 150, and establishes a voltage there-across. It should be noted that given the inductive nature of the magnetic field generator winding 150, initially this inductor-winding exhibits a very large impedance that behaves as almost an "open circuit," resulting in generation of a large voltage across the magnetic field generator winding 150. A diode 152 is placed in parallel to the magnetic filed generator 150 to protect electronic circuits associated with the electromagnetic device 120 against negative transients or spikes that may be generated by the magnetic field generator 150. The diode 152 limits the amount of negative transient voltage produced across the winding by allowing the initial current of the signal at point 5 to also pass through the diode 152. With a lower overall initial impedance of a diode-winding combination, this parallel combination lowers the overall voltage across both components. After a short time, the inductor-winding behaves as a "short-circuit," with negligible impedance, which allows all current to pass there through. At this time, the switch S3 is still closed (is ON), allowing all current to pass through the switch S3 and to the ground. While the current passes through the inductor during its "short-circuit" phase it generates a magnetic field, which induces electric current through each phase $\phi1$, $\phi2$, and $\phi3$ of the respective electrical signal generator windings W1, W2, and W3. The mechanical force that rotates the entire electromagnetic device 120 increases the strength of this magnetic field, which in turn increases the current and the voltage induced onto each phase $\phi1$, $\phi2$, and $\phi3$ of the respective electrical signal generator windings W1, W2, and W3, which produce an amplified signal based on the input signal at point 5. The cycle repeats by the modulator buffer switch S3 being modulated back to the open (OFF position), and then back ON again.

As further illustrated in FIG. 3, the system input signal at point 2 is also coupled with the polarity bias and gate deriver circuitry 140. The polarity bias and gate deriver circuitry 140 is comprised of a polarity detector 104 that detects the polarity of the system input signal at point 2. The polarity detector 104 is comprised of a linear signal amplifier U2 with a controlled gain settled by the resistors R5 and R6. The combined resistances of the resistors R5 and R6 form a voltage divider circuit, which couples to a negative input terminal of a linear signal amplifier U2. The resistors R5 and R6 determine the gain of the bias compensation that is required by the signal amplifying system 100. As described above, the polarity detector circuit 104 produces signals at point 6 that are coupled through a biasing scheme 110 and the respective first and second buffer-derivers 112 and 114 to derive and gate the respective transistors S2 and S1 in accordance with the detected polarity of the system input signal at point 2.

The bias 110 of the polarity bias and gate deriver circuitry 140 functions to eliminate and correct cross-over distortions from the respective first and second output full-wave power rectifiers 124 and 126 when the system input signal at point 2 nears and crosses the zero volts. The bias circuit 110 is generally comprised of the resistors R8 to R11 that function to maintain the appropriate level of bias voltage required at signal points 7 and 8 to gate the switches S1 and S2. The size of the resistors R8 to R11 determine the amount of bias that is applied to the entire system.

The component 302 within the bias circuit 110 is a well-known thermal drift compensation circuit, which compensates for voltage variations (or drifts) of semiconductors due to temperature variations, a phenomenon well known in the art. In general, the impedance of the thermal drift compensation circuit 302 increases when the temperature of the circuit 100 is reduced, and the impedance of the thermal drift compensation circuit 302 decreases when the temperature of the circuit 100 is increased. In a well-known exemplary method in designing a temperature-compensated bias reference, one starts with a predictable temperature drift, and then finds another predictable temperature source with a temperature drift in the opposite direction that can be scaled by a temperature independent scale factor. Then, by proper circuit design (well-known in the art), the effects of the two opposite-polarity drifts are made to cancel, resulting in a nominally zero temperature coefficient voltage level.

Three well-known basic temperature drift sources exist that are reasonably predictable and repeatable. The first is the temperature dependence of a bipolar transistor base-emitter voltage drop $V_{BE}$ that exhibits a strong negative temperature coefficient, typically about −2 mV/° C. The second is the temperature dependence of the $V_{BE}$ difference ABE between two transistors, which is proportional to absolute temperature through the thermal voltage $V_T$ and thus exhibits a positive temperature coefficient. The third and last temperature drift source is that of the base-emitter voltage of a Zener diode $V_Z$, which is inherently low and positive in polarity. By scaling one or more of these drift sources and subtracting them from each other, one may achieve the required compensation to provide a temperature independent bias voltage.

The thermal drift compensation circuit 302 is coupled with a base terminal of the transistor Q2 and a base terminal of a transistor Q1. The collector terminal of the transistor Q2 is coupled with a +12V supply and resistor R10, and the collector terminal of the transistor Q1 is coupled with a −12V supply line and resistor R1 1. The emitter terminal of the transistor Q2 is coupled with a first end of a resistor R7, forming the first buffer-deriver 112; the emitter terminal of the transistor Q1 is coupled with a first end of a resistor R13 forming the second buffer-deriver 114. The second ends of the resistors R7 and R13 are coupled with one another.

The respective first and second buffer-derivers 112 and 114 increase the current capability at the points 7 and 8 of the system to derive the respective switches S2 and S1, and may in fact be referred to as MOSFET derivers. The transistors Q1 and Q2 simply amplify the current passing through their Collector-Emitter electrodes in relations with the value of the resistors R8 to R11, and output the resulting amplified current at points 7 and 8 to derive the respective MOSFET switches S1 and S2. The resistors R7 and R13 also function as current limiters, which limit the current that passes through the collector-emitter electrodes of the transistors Q1 and Q2.

The state of the switches S1 and S2 determine if the one or more electrical signal generator windings W1, W2, and W3 carry a positive or negative signal, and derive the two output full-wave power rectifiers 124 and 126 coupled thereto accordingly. As was described above, the state of the switches S1 and S2 are determined by the polarity detector circuit 104, which programs the polarity of the output signal based on the polarity of the main input signal 101. The first output full-wave power rectifier circuit 124 is comprised of diodes D1, D2 and D3, and the second output full-wave power rectifier circuit 126 is comprised of diodes D5, D6, and D7. The first output full-wave power rectifier circuit 124 rectifiers a first polarity signal, resulting in a signal at point 9, illustrated in FIG. 2(I) when the switch S2 is activated to ON by the first buffer-driver 112. The second output full-wave power rectifier circuit 126 rectifies a second, opposite polarity signal, resulting in a signal at point 10, illustrated in FIG. 2(J) when the switch S1 is activated to ON by the second buffer-driver 114. It should be noted that switches S1 and S2 are turned ON and OFF in accordance with the polarity of the system input signal at point 2, which is detected by the polarity detector 104.

When switch S2 is ON, the signal value at point 9 is zero (illustrated in the first one half of the graph of FIG. 2(I)), with current from the respective phase lines φ1, φ2, and φ3 of the electromagnetic device 120 at the respective points 13, 14, and 15 passing through the respective diodes D1, D2, and D3 to ground. This generates a signal at the center tap CT, which is the output at point 11 that is shown in FIG. 2(K). When the switch S2 opens (S2 is OFF) and the switch S1 closes (S1 is ON), all current from the respective phase lines φ1, φ2, and φ3 of the electromagnetic device 120 at the respective points 13, 14, and 15 pass through the diodes D1, D2, and D3, and are diverted through the diodes D4 and D8. The voltage produced across the diodes D4 and D8 as a result of this switching action is a positive voltage, with the signal at the CT shown in FIG. 2(L). The combined or collective input to the recovery circuit 128 at point 11 is illustrated in FIG. 2(M). In general, the diodes D4 and D8 are optional, and when separately coupled with the inductor L1 and the capacitor C1 of the filter-demodulator 128 through the respective turn-OFF switching action of S2 and S1, they function as well-known buck converters.

The recovery circuit 128 is the filter-demodulator that is comprised of the inductor L1 and the capacitor C1, the output of which is at point 12 and illustrated in FIG. 2(N) when the switch S2 is ON and shown in FIG. 2(Q) when the switch S1 is ON and collectively illustrated in FIG. 2(P) as the output to the load 130. The filtering components (L1 and C1) of the recovery circuit 128 form a second order filter that filter out the high switching frequency component (the modulation component) of the signal at point 11 (FIG. 2(M)). This results in an amplified version of the main input signal 101, which is then coupled with the load 130. As further illustrated in FIG. 3, the signal amplifying system 100 of the present invention further includes a feedback circuitry 138 that is coupled with respective feedback lines 132, 134, and 136 to receive feedback from respective signals at respective points 16, 12, and 11. It should be noted that not all three feedbacks are required.

The switching feedback line 136 senses the actual pulses at point 11 illustrated in FIGS. 2(K), 2(L), and 2(M), and compares the sensed signals with the main input signal 101 to adjust for variations in the electrical characteristics (parameters) of the signals at point 11. The unwanted variations of the signal at point 11 is corrected by comparison of signals at point 11 with that of main input signal 101 through a voltage divider circuitry and a resistor-capacitor filter combination of the feedback circuitry 138. However, the comparator circuit 102 performs the actual correction.

The signal at point 11 is an amplified signal with a large amplitude, and therefore cannot be directly coupled with the comparator circuit 102. As a result, the signal at point 11 is first passed through a voltage divider circuit within the feedback circuitry 138 to reduce its amplitude before it is coupled with the comparator circuit 102. The voltage divider circuitry within the feedback circuit 138 is comprised of the series coupled resistors R15 and R16, with their connecting node coupled with resistor R14, which, in turn, is coupled with the negative terminal of the comparator circuit 102. The voltage divider circuitry determines the gain made at the signal point 11, and reduces it for feedback into the comparator circuit 102 for correcting distortions in the waveform of the signals at point 11, including amplitude abnormalities.

In addition, recall that the main input signal 101 was modulated, and hence, the signal at point 11 has a modulation carrier. Therefore, in order to compare the signal at point 11 with the main input signal 101 (that has no modulations) for corrections, the modulation carrier signal portion of the signal at point 11 must be removed, which is a function performed by the resistor-capacitor filter of the feedback circuitry 138. Accordingly, the resistor-capacitor filer that is comprised of the parallel combination of the resistor R16 and the capacitor C4 filters out or removes the carrier signal (the modulation part) from the signal at point 11 to convert the signal at point 11 to an exemplary sine wave or any other wave commensurate with the form of the main input signal 101 for comparison. The switching feedback for the signal at point 11 is therefore comprised of resistors R14, R15, R16, and C4, which improves the overall system stability in relation to the variations in load impedances.

The output feedback line 134 sense the actual output at point 12 illustrated in FIGS. 2(N), 2(Q), and 2(P), and compares the sensed signals with the main input signal 101 to adjust for variations in the electrical characteristics (parameters) of the signals at point 12. The feedback loop comprised of the resistors R2, R3, R18, and capacitors C2 and C5 reduce the overall gain of the system, and compensate for the phase lag shift created by the output of the recovery circuit 128, in addition to maintaining low distortions for the output signals at point 12.

As described above in relation to FIG. 1, the recovery circuit 128 (the LC filter-demodulator) changes the phase of the input signal to the circuit 128 at point 11 in relation to the phase of the same signal at the output of the recovery circuit 128 at point 12, at the resonant frequency of the recovery circuit 128. This change in the phase of the output signal at point 12 may not coincide with the phase of the main input signal 101, which may generate oscillation. The output feedback line 134 of the feedback circuitry 138 along with the electrical components coupled thereto obviates oscillations within the signal amplifying system 100. However, as with the signal at point 11 on the switching feedback line 136, the signal at point 12 is an amplified signal with large amplitude, and therefore cannot be directly coupled with the comparator circuit 102. As a result, the signal at point 12 is first passed through a voltage divider circuit within the feedback circuitry 138 to reduce its amplitude before it is coupled with the comparator circuit 102. The voltage divider circuitry within the feedback circuit 138 for the output feedback line 134 is comprised of the resistor R18 in combination with the resistors R2, R3, and R17 that form a network of voltage dividers to determine and control the gain of the output signal 12 coupled with the negative terminal of the comparator circuit 102. The voltage divider circuitry determines the gain made at the signal point 12, and reduces it for feedback into the comparator circuit 102 for correcting distortions in the waveform of the signals at point 12, including amplitude abnormalities.

The feedback circuit 138 uses a phase lag compensation circuit to compensate for any phase variations of signal at point 12 to avoid oscillations. The phase log compensation circuit of the feedback circuitry 138 is comprised of two first order high-pass filters to counter (or boost) the signal at 12 output from the second order low-pass filter components (L1 and C1) of the recovery circuit 128. The first, first order high-pass filter includes a capacitor C5 and the combined resistances of the resistors R3 and R2, and the second of the first order high pass filters includes the capacitor C2 and the combined resistances of the resistors R18, R17 and R2. The electrical parameter values for the first order high-pass filter components are preferably selected so their frequency is at or below the resonant frequency of the low-pass filter components (L1 and C1) of the recovery circuit 128. Ideal, it is desirable to have phase of 0° in order to maintain stability (no oscillation) within the entire signal amplifying system 100. It should be noted that instead of using two first order RC filtering circuit, a single LC circuit may be used instead. However, the RC combination is preferable because it is less bulky, and easier to use. The feedback line 132 at the signal point 16 is comprised of the resistor R18 and the capacitor C5, which are connected directly to one of the load terminals to avoid cable wiring losses and maintain a low damping factor.

The present invention eliminates several of the prior art components due to routing of the main input signal 101 through the electromagnetic device 120. Non-limiting examples of components eliminated includes an isolation transformer, power transformers, transformer switches, power supplies, amplifiers, and inverters/converters, resulting in a more efficient system because all losses associated with the use of these eliminated components have also been eliminated.

The present invention has a wide variety of different applications and may be used and applied in different technological fields, non-limiting examples of which may include most forms of transportation systems, audio systems, and any technology requiring amplification, saving, or conversion of energy. A more specific, non-limiting examples of such external systems using the signal amplifying system 100 of the present invention are described below, and illustrated in FIGS. 4 to 12. For the sake of brevity, clarity, and convenience the general descriptions of FIGS. 4 to 12 will not repeat every corresponding or equivalent component that has already been described above in relation to FIGS. 1 to 3.

Figure 4:
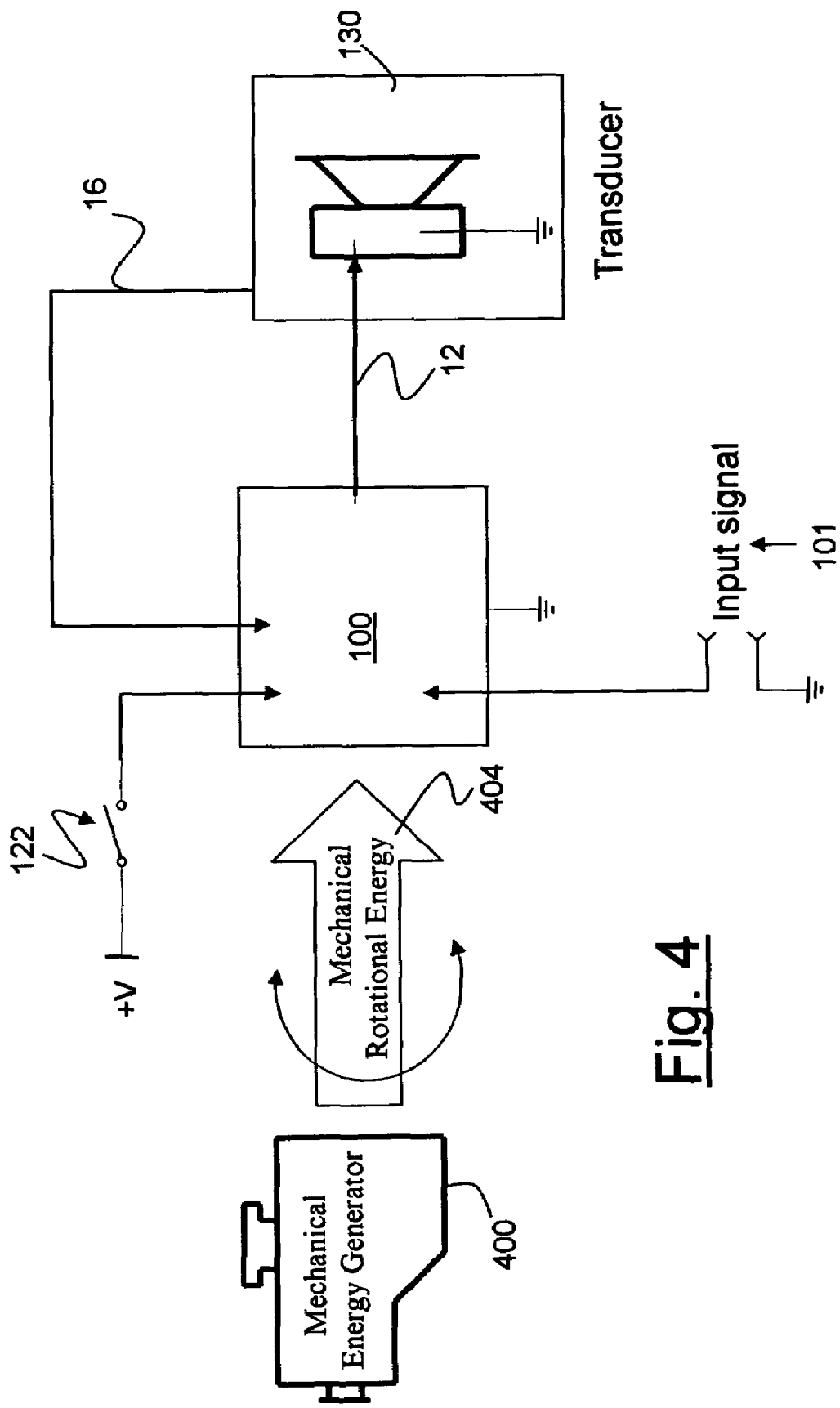
FIG. 4 is an exemplary illustration of the signal amplifying circuit of the present invention, used as a power amplifier for deriving transducer loads in accordance with the present invention.

FIG. 4 is an exemplary schematic illustration of the signal amplifying system 100 of the present invention used for deriving a load 130, in this instance a transducer load, and more specifically, an audio transducer load. As illustrated, the signal amplifying system 100 (the details of which are described above in relation to FIGS. 1 to 3) is coupled with a mechanical energy generator 400 that produces mechanical rotational energy 404 (by turning a shaft, for example). The mechanical rotational energy 404 is supplied to the device 120 of the signal amplifying system 100, which rotates to convert the mechanical rotational energy 404 into electrical energy as the output signal 12 at the output of system 100. As described above in relation to FIGS. 1 to 3, the non-limiting example of an electromagnetic device 120 that may be used within the signal amplifying system 100 of the present invention may include any well-known devices that convert mechanical energy into electrical energy, for example, an alternator. The input signal 101 is processed by the signal amplifying system 100, and is amplified and output as signal 12 to one or more transducer type loads 130. Any input signal frequency, including subwoofer signals, may be used. Therefore, for example, the circuit topography illustrated in FIG. 4 can be used as a subwoofer power amplifier for deriving a transducer load, such as the speakers of a stereo system.

Non-limiting examples of the mechanical energy generator 400 may include devices that can provide mechanical motion, including an electrical power station that provides electrical energy to a mechanical device for a mechanical rotational movement of an electrical motor. For example, an electrical power station can provide electrical power to an electrical motor of an electrical train, which provides mechanical rotational energy for moving the train. Other non-limiting examples of mechanical energy generators 400 may include a combustion engine of cars, motorcycles, or boats, an electrical motor of an electrical vehicle, an aircraft engine, or any other device or generator that can generate mechanical energy.

Figure 5:
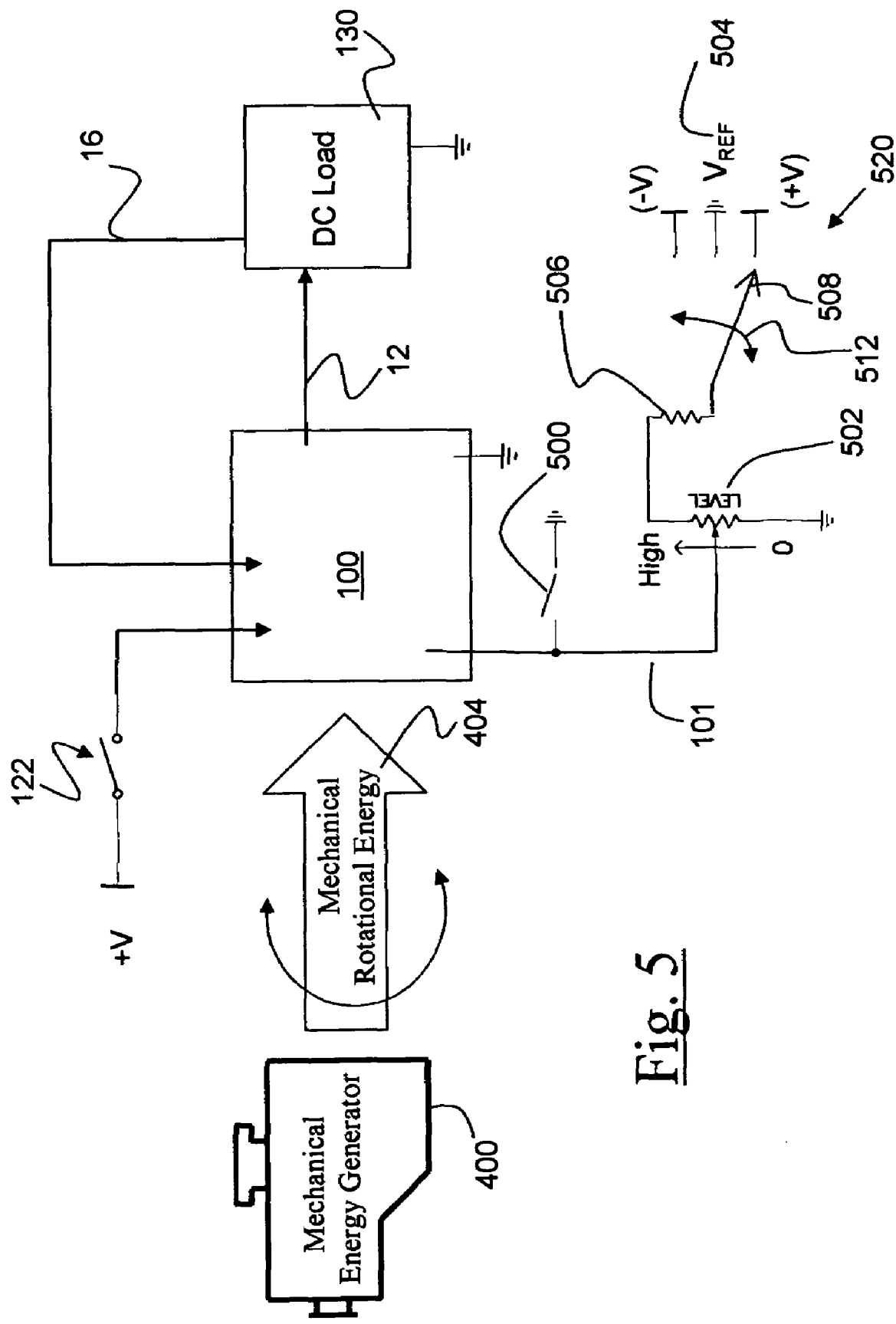
FIG. 5 is an exemplary illustration of the signal amplifying circuit of the present invention, used as a programmable voltage regulator in accordance with the present invention.

FIGS. 5 is an exemplary schematic illustration of the signal amplifying system 100 of the present invention used in conjunction with a potentiometer 520 functioning as a programmable voltage regulator for deriving a load 130, in this instance a DC load. For the sake of brevity, clarity, and convenience the general descriptions of FIGS. 5 to 12 will not repeat every corresponding or equivalent component that has already been described above in relation to FIGS. 1 to 4.

As illustrated, a potentiometer 520 allows for varying the electrical parameters of the input signal 101 before it is input to the signal amplifying system 100 for later processing and amplification as the output signal 12 to load 130. The potentiometer 520 illustrated in FIG. 5 includes a variable resistor 502 coupled with ground at one end thereof, and with a protection resistor 506 at its other end. The variable resistor 502 may be used to increase or decrease one or more electrical parameters of the input signal 101. The switching "arm," 508 coupled with the protection resistor 506 may be moved in the direction indicated by the arrow 512 to either a positive, negative, or neutral (ground) to supply the variable resistor 502 with positive, negative, or ground electrical parameter (in this instance, a voltage). Therefore, the potentiometer 520 may be programmed to provide the load 130 with a positive or a negative regulated, and amplified signal. Hence, if a positive reference (+V) is selected (as indicated by the switch arm 508 in FIG. 5), the input signal 101 may be varied from 0 to some higher positive value voltage by the variable resistor 502. On the other hand, if a negative reference (−V) is selected, the input signal 101 may be varied from some 0 to some higher negative value voltage by the variable resistor 502. Regardless, the negative or positive variations of the input signal 101 is input to the signal amplifying system 100 in accordance with the present invention (described in relation to the illustrated FIGS. 1 to 3), and output as a programmed (positive or negative) voltage regulator single 12 to the load 130. Therefore, it should readily be apparent to those skilled in the art that either a negative or a positive output signal 12 may be generated and used, depending on the load requirements. The illustrated switch 500 may be used to shut-off all supplies of signal 101 to the signal amplifying system 100 of the present invention by diverting the signal 101 to ground when switch 500 is closed. The protection resistor 506 provides sufficient impedance to prevent the flow of signal 101 back to the voltage reference source $V_{ref}$504 when the switch 500 is closed. Accordingly, in case switch 500 is activated (closed), the input signal 101 will take the path of least resistance, and be passed to the ground via the switch 500.

Figure 6:
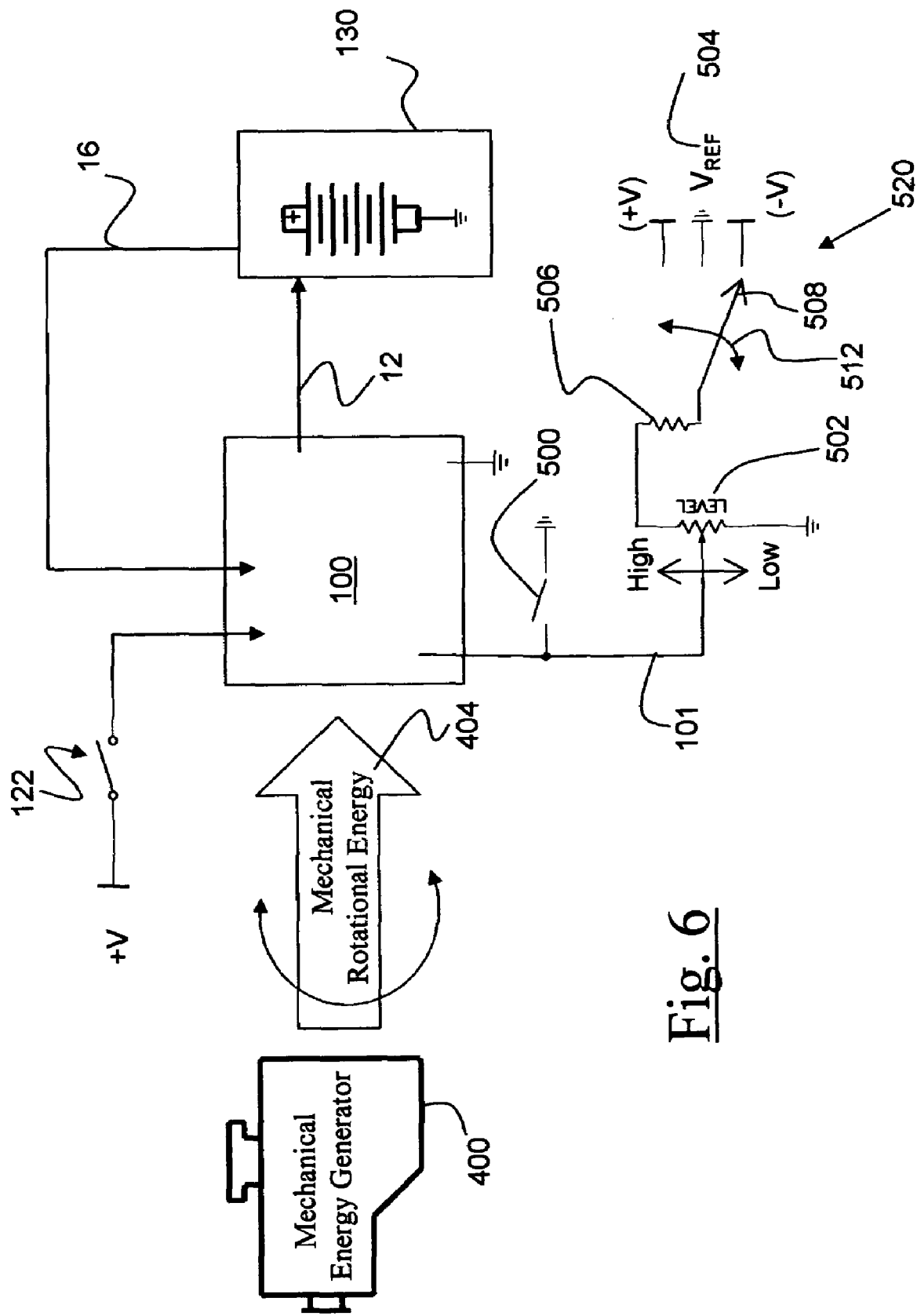
FIG. 6 is an exemplary illustration of the signal amplifying circuit of the present invention, used as a recharging circuit for recharging a power source in accordance with the present invention.

FIG. 6 is one very specific example for using the programmable voltage regular of the present invention illustrated in FIG. 5. As illustrated in FIG. 6, the DC load 130 may be a battery where amplified regulated voltage as signal 12 is output and supplied to the load 130 (in this case the battery) for charging the load in accordance with the principles and teaching of the present invention disclosed in relation to FIGS. 1 to 5.

Figure 7:
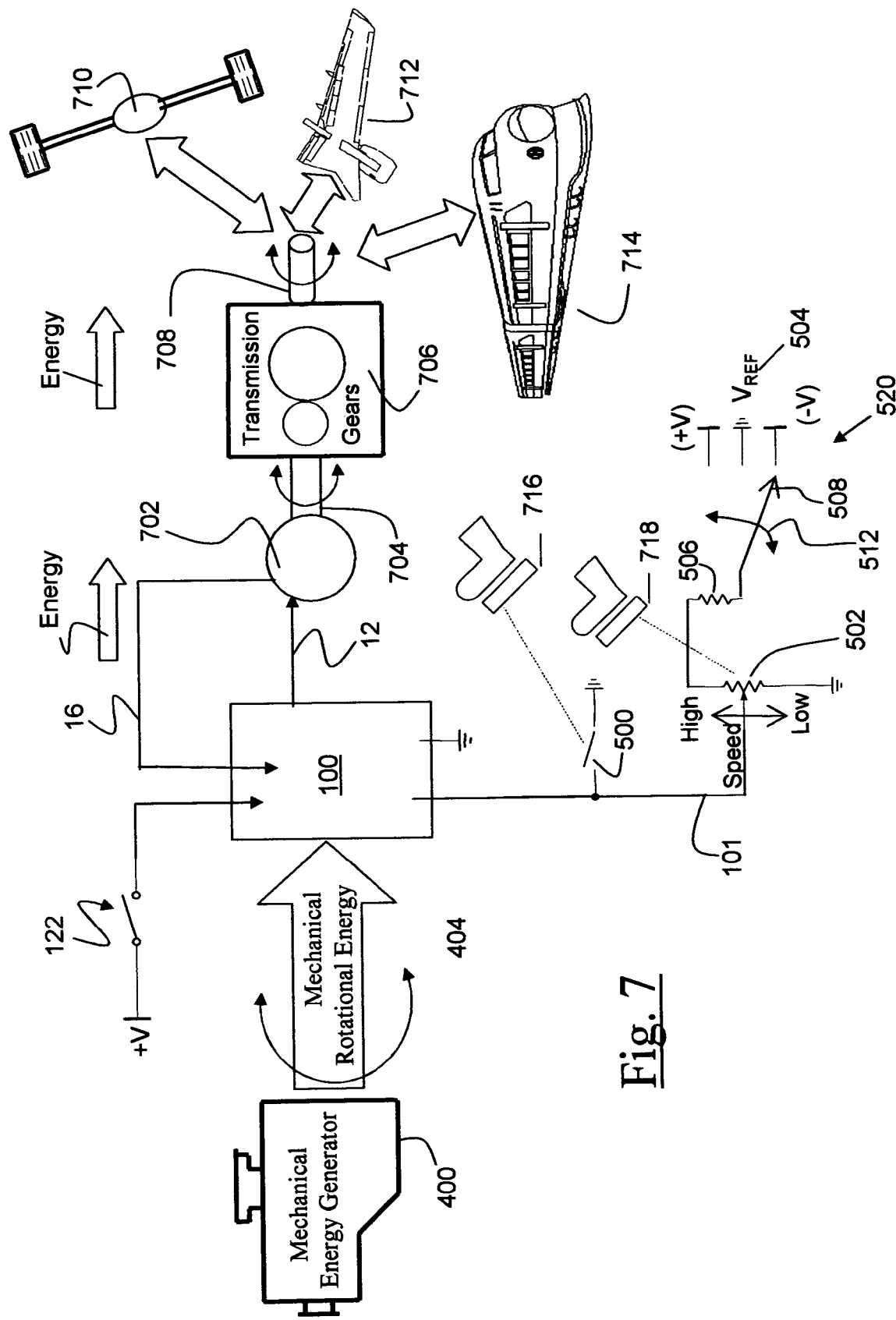
FIG. 7 is an exemplary illustration of the signal amplifying circuit of the present invention, used for driving a DC motor, which, in turn, drives a drive unit of a transportation system in accordance with the present invention.

FIG. 7 is another very specific example of using the programmable voltage regular of the present invention illustrated in FIGS. 1 to 6. As illustrated in FIG. 7, the DC load 130 of FIGS. 1, 3, and 4 to 6 may be comprised of one or more well-known DC motors 702 that derive one or more shafts 704 to actuate well-known exemplary transmission gear systems 706, which, in turn, derive one or more shafts 708 of one or more transportation systems. Non-limiting examples for transportation systems or vehicles that exemplary shafts 708 or the like may be coupled with include differential satellite gear system 710 of motor cars to move the wheels of the cars, motor cycles, engines (jet or propeller type) that move an aircraft 712, or electrical trains 714, such as electrical metrorail systems used in most urban metropolitan areas. For the sake of brevity, clarity, and convenience the general descriptions of FIGS. 7 will not repeat every corresponding or equivalent component that has already been described above in relation to FIGS. 1 to 6.

As illustrated in FIG. 7, the potentiometer 520 of the present invention in combination with the signal amplifying system 100 may be implemented to vary the speed of the DC motor 702 to vary the speed of the transportation systems that use the present invention. As one very specific example, the variable resistor 502 may be actuated by an acceleration unit 718 to increase the electrical parameters for the input signal 101 coupled with the signal amplifying system 100 of the present invention, as described above, in relation to FIGS. 1 to 6. In case of a car, the acceleration unit 718 may comprise of a "gas pedal" to increase the speed of the car by increasing the electrical parameters of the input signal 101, and in case of an aircraft, motor boat, or electrical trains the acceleration unit 718 may comprise of a throttle to increase thrust. In particular, in instances where the system of FIG. 7 is used in an aircraft, the actuation of the acceleration unit 718 may also vary the fore ailerons and or aft wing elevators via the DC motor 702 to further facilitate the variation in the speed of the aircraft. The switch 500 may be actuated by a deceleration unit 716, which may be a "break pedal" of a car, or the throttle or a break system used in trains or aircraft, including actuation of the movement of fore ailerons and or aft wing elevators of an aircraft via DC motor 702 to vary its speed.

As has been described, increasing or decreasing the electrical parameters of the input signal 101 will provide a commensurate amplified output signal 12 to the DC motor 702, which, in turn, will vary the speed of the transportation systems within which the present invention is used, without much added energy. Hence, if the transportation systems use electrical power, a required need in increased speed by the transportation systems is achieved (augmented) by the variation of input signal 101 and the amplification of this signal by the signal amplifying system 100 of the present invention, without draining more electrical power from main or auxiliary power sources, such as batteries used in electrical vehicles. It should further be noted that the use of the signal amplifying system 100 of the present invention has also eliminated the need for a DC-to-DC converter required by most prior art systems, before a signal is coupled with a DC motor. The elimination of a DC-to-DC converter substantially reduces manufacturing costs and power usage.

Figure 8:
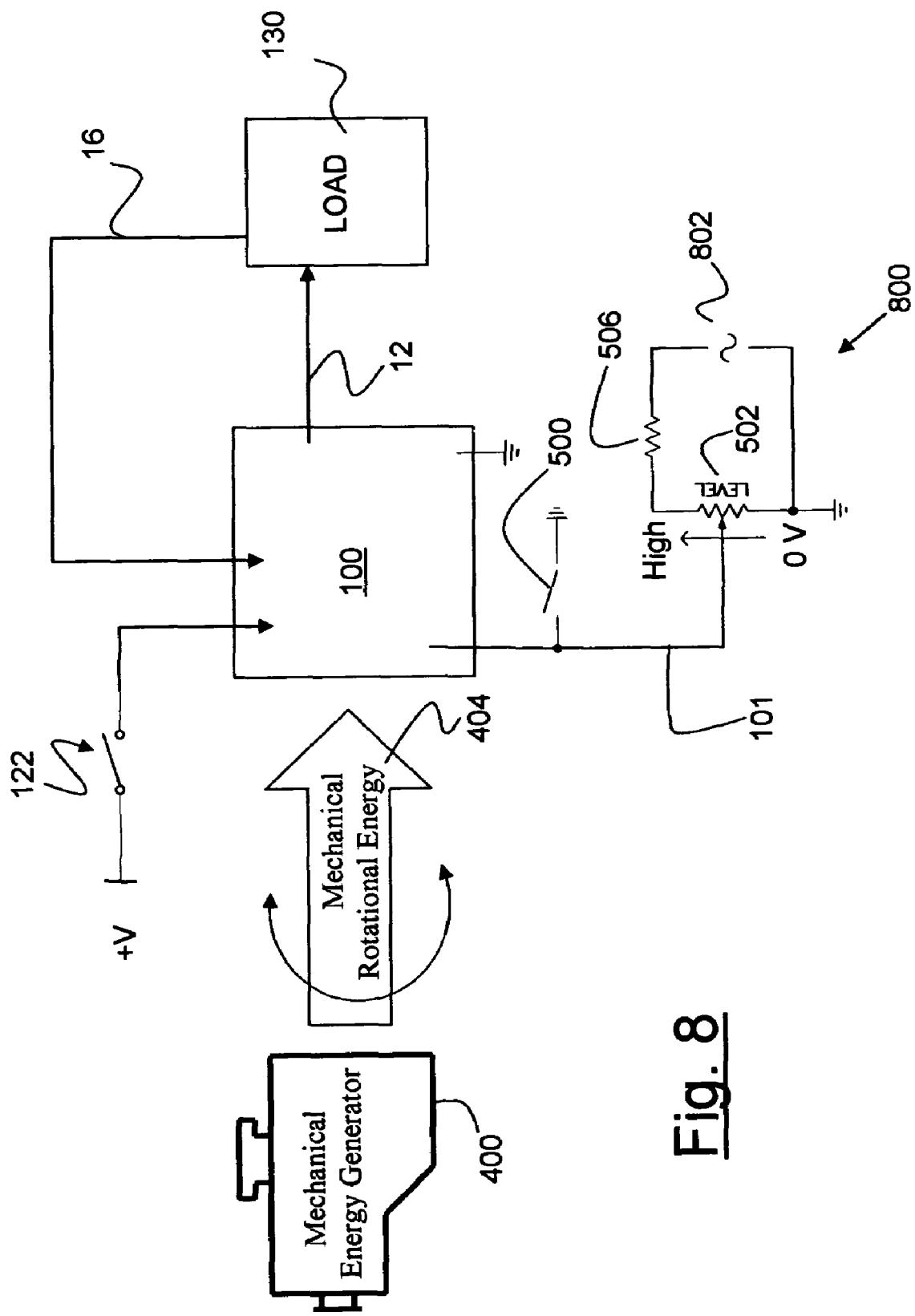
FIG. 8 is an exemplary illustration of the signal amplifying circuit of the present invention, used with an AC voltage reference for a supply to an AC load in accordance with the present invention.

FIGS. 8 is an exemplary schematic illustration of the signal amplifying system 100 of the present invention used in conjunction with an AC reference source 800 functioning as a programmable AC voltage regulator for deriving a load 130, in this instance an AC load. For the sake of brevity, clarity, and convenience the general descriptions of FIGS. 8 to 11 will not repeat every corresponding or equivalent component that has already been described above in relation to FIGS. 1 to 7.

As illustrated, an AC reference source 800 allows for varying the electrical parameters of the input signal 101 before it is input to the signal amplifying system 100 for later processing and amplification as the output signal 12 to AC load 130. The AC reference source 800 illustrated in FIG. 8 includes a variable resistor 502 coupled with ground at one end thereof, and with a protection resistor 506 at its other end. The variable resistor 502 may be used to increase or decrease one or more electrical parameters of the input signal 101. The AC reference 800 is comprised of an AC signal generator 802, which may, for example, generate a 400 Hz sine wave signal that can be varied by the variable resistor 502 to generate signal 101 prior to input to the signal amplifying system 100 of the present invention. The resulting output signal 12 from the signal amplifying system 100 then becomes a 400 Hz regulated AC source for the AC load 130.

The illustrated switch 500 may be used to shut-off all supplies of signal 101 to the signal amplifying system 100 of the present invention by diverting the signal 101 to ground when switch 500 is closed. The protection resistor 506 provides sufficient impedance to prevent the flow of signal 101 back to the AC reference source 802 when the switch 500 is closed. Accordingly, in case switch 500 is activated (closed), the input signal 101 will take the path of least resistance, and be passed to the ground via the switch 500.

Figure 9:
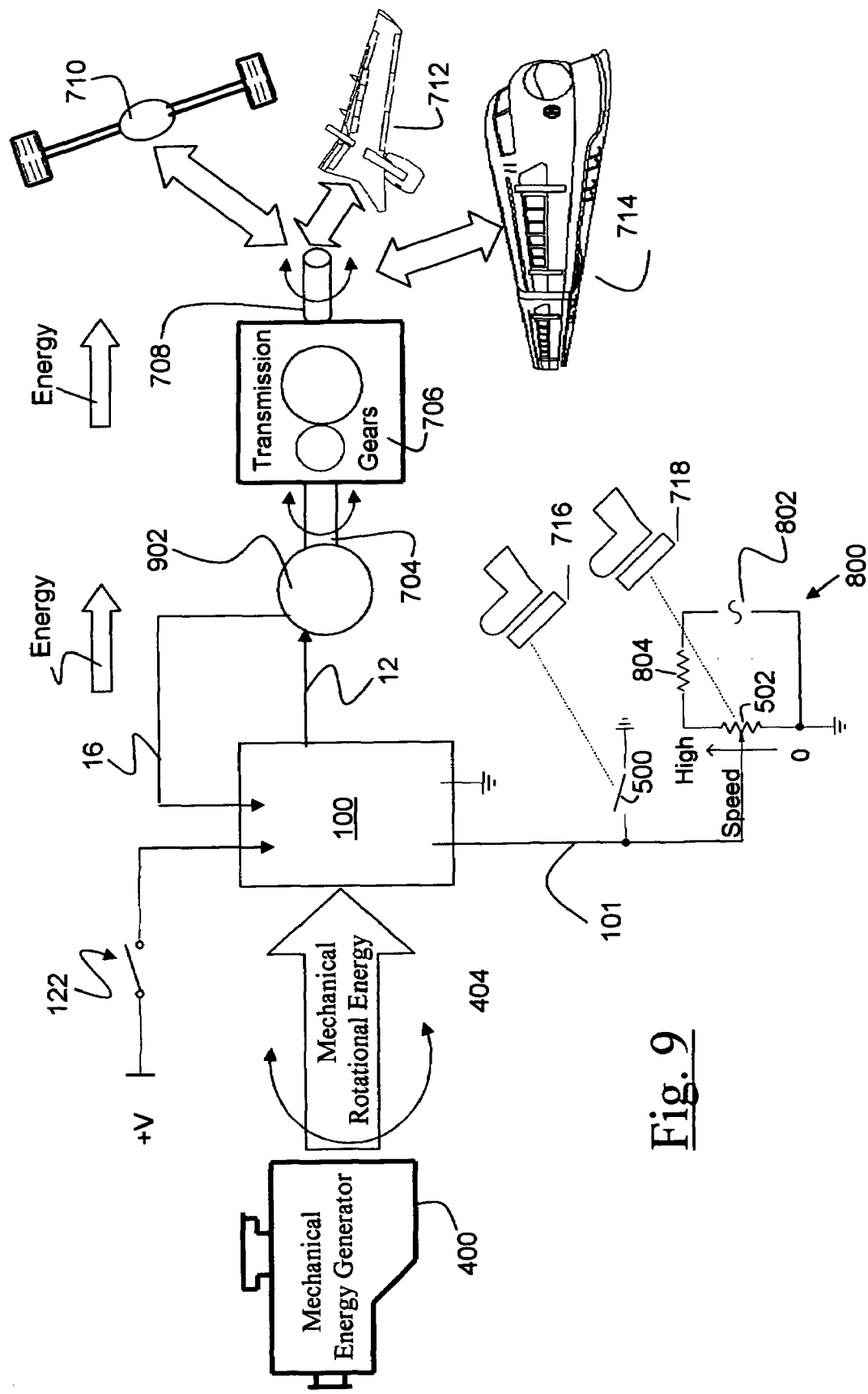
FIG. 9 is an exemplary illustration of the signal amplifying circuit of the present invention, used for driving an AC motor, which, in turn, drives a drive unit of a transportation system in accordance with the present invention.

FIG. 9 is another very specific example for using the AC reference regulator of the present invention illustrated in FIGS. 8. As illustrated in FIG. 9, the AC load 130 of FIG. 8 may be comprised of one or more well-known AC motors 902 that derive one or more shafts 704 to actuate well-known exemplary transmission gear systems 706, which, in turn, derive one or more shafts 708 of one or more transportation systems. Non-limiting examples for transportation systems or vehicles that exemplary shafts 708 or the like may be coupled with include differential satellite gear system 710 of motor cars to move the wheels of the cars, motor cycles, engines (jet or propeller type) that move an aircraft 712, or electrical trains 714, such as electrical metro-rail systems used in most urban metropolitan areas. For the sake of brevity, clarity, and convenience the general description of FIGS. 9 will not repeat every corresponding or equivalent component that has already been described above in relation to FIGS. 1 to 8.

As illustrated in FIG. 9, AC reference generator 800 of the present invention in combination with the signal amplifying system 100 may be implemented to vary the speed of the AC motor 902 to vary the speed of the transportation systems that use the present invention. As one very specific example, the variable resistor 502 may be actuated by an acceleration unit 718 to increase the electrical parameters for the input signal 101 coupled with the signal amplifying system 100 of the present invention, as described above, in relation to FIGS. 1 to 8. In case of a car, the acceleration unit 718 may comprise of the "gas pedal" to increase its speed by increasing the electrical parameters of the input signal 101, and in case of an aircraft, motor boat, or electrical trains the acceleration unit 718 may comprise of a throttle to increase thrust. In particular, in instances where the system of FIG. 9 is used in an aircraft, the actuation of the acceleration unit 718 may also vary the fore ailerons and or aft wing elevators via the AC motor 902 to further facilitate the variation in the speed of the aircraft. The switch 500 may be actuated by a deceleration unit 716, which may be a "break pedal" of a car, or the throttle or a break system used in trains, aircraft, or other vehicles including actuation of the movement of fore ailerons and or aft wing elevators of an aircraft via AC motor 902 to vary its speed.

As has been described, increasing or decreasing the electrical parameters of the input signal 101 will provide a commensurate amplified output signal 12 to the AC motor 902, which, in turn, will vary the speed of the transportation systems within which the present invention is used, without much added energy. Hence, if the transportation systems use electrical power, a required need in increased speed by the transportation systems is achieved (augmented) by the variation of input signal 101 and the amplification of this signal by the signal amplifying system 100 of the present invention, without draining more electrical power from main or auxiliary power sources, such as batteries used in electrical vehicles. It should further be noted that the use of the signal amplifying system 100 of the present invention has also eliminated the need for an AC converter required by most prior art systems, before a signal is coupled with an AC motor. The elimination of an AC converter substantially reduces manufacturing costs and power usage.

Figure 10:
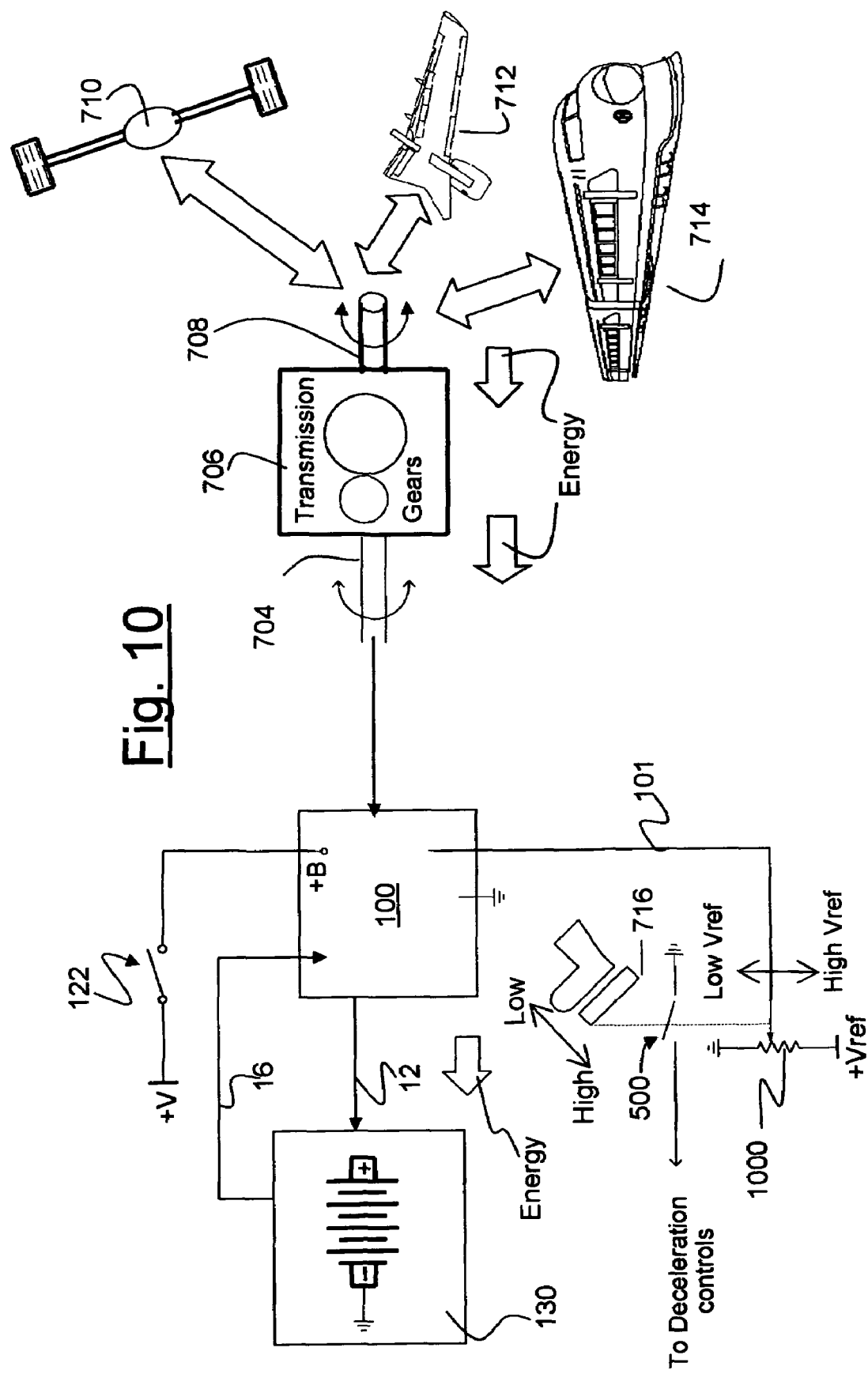
FIG. 10 is an exemplary illustration of the signal amplifying circuit of the present invention, used with a deceleration unit of a transportation system in accordance with the present invention.

FIG. 10 is an exemplary illustration for the signal amplifying system 100 of the present invention used in combination with a deceleration unit 716 to redirect energy to a load 130, in this instance, for recharging a power source unit. For the sake of brevity, clarity, and convenience the general description of FIG. 10 will not repeat every corresponding or equivalent component that has already been described above in relation to FIGS. 1 to 9. As illustrated in FIG. 10, as the deceleration unit 716 is actuated (application of breaks), the switch 500 closes to activate various components, such as a break lights, or an entire separate switching system that switches the output signal 12 from the motors (D)C or AC illustrated in FIGS. 7 and 9) to main or auxiliary power sources. Simultaneously, the amount by which the deceleration unit 716 is applied commensurately varies the impedance of a variable resistor 1000 for generating a voltage reference Vref, which is coupled with the signal amplifying system 100 of the present invention as the input signal 101. Hence, the higher or stronger the pressure for the deceleration, the higher the value of Vref, which translates into a higher level of input signal 101 coupled with the signal amplifying system 100. As has been described, increasing or decreasing the electrical parameters of the input signal 101 will provide a commensurate amplified output signal 12, which, in turn, will vary the amount by which the illustrated power source is charged.

Figure 11:
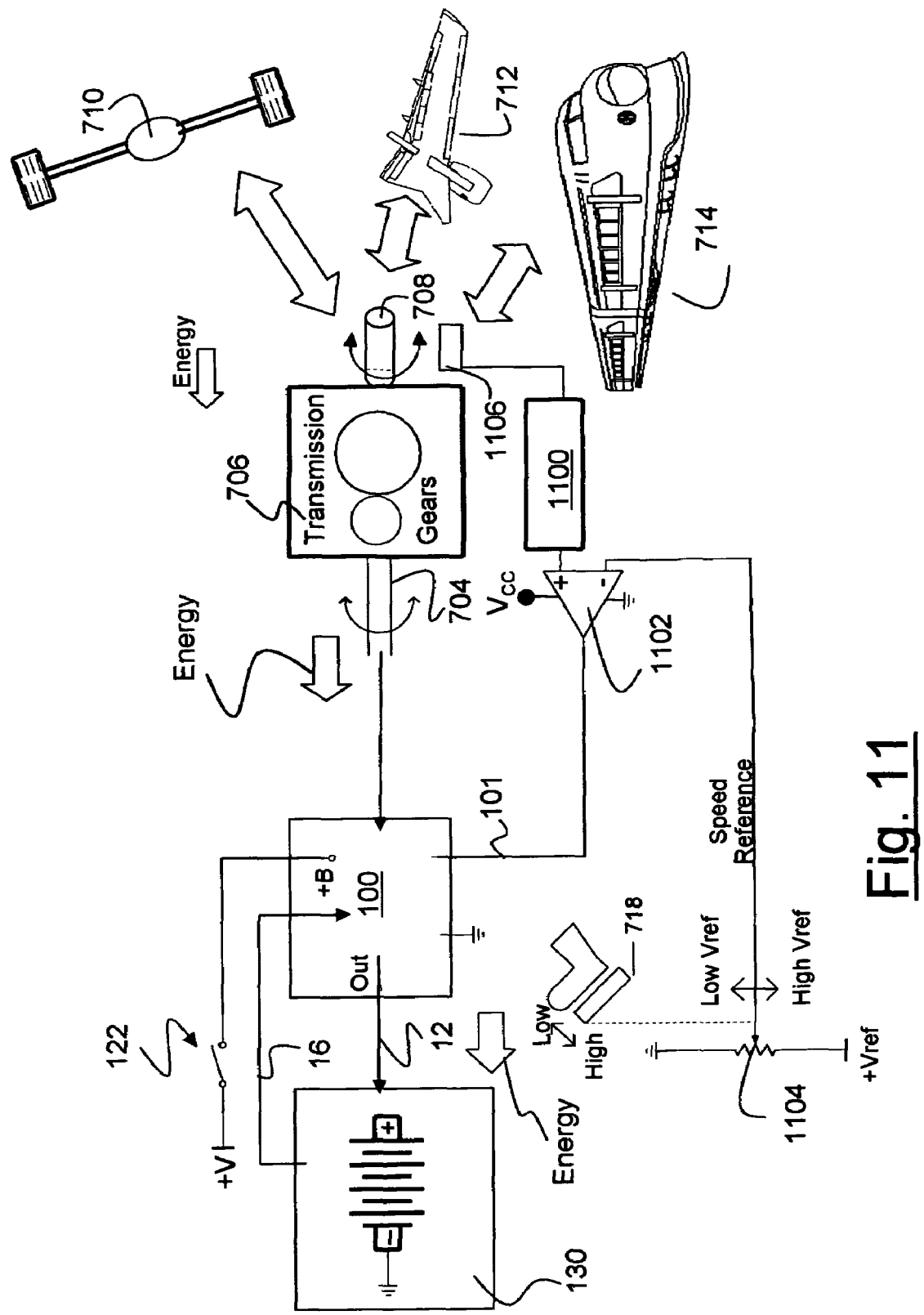
FIG. 11 is an exemplary illustration of the signal amplifying circuit of the present invention, used with an acceleration unit of a transportation system in accordance with the present invention.

FIG. 11 is an exemplary illustration for the signal amplifying system 100 of the present invention used in combination with an acceleration unit 718 to redirect energy to a load 130, in this instance, for recharging a power source unit. For the sake of brevity, clarity, and convenience the general description of FIG. 11 will not repeat every corresponding or equivalent component that has already been described above in relation to FIGS. 1 to 10. FIG. 11 illustrates a scenario wherein the transportation system is in motion, and it accelerates or decelerates without using the deceleration unit 716 (without the application of breaks to slow down). FIG. 11 illustrates the use of a speed sensor 1106 in relation to the shat 708 for detecting the acceleration or deceleration of the transportation system for redirecting energy flows. A non-limiting example for such a scenario would be for when a transportation system is decelerated by reducing the amount of acceleration rather than the application of the transportation system breaks. The variable resistor 1104 is used in relation with the accelerator unit 718 to vary the amount of energy that may be harnessed from a transportation system in motion for charging a load 130, in this instance, a power source when the transportation system decelerates.

The speed sensor 1106 senses the vehicle's speed and provides a voltage that is representative of the sensed speed as $V_{speed}$ 1100 to the positive terminal of a biased speed comparator circuit 1102. As the transportation system is decelerated by the easing of the acceleration unit (e.g., the removal of the foot from the "gas pedal" or the pulling back of the "throttle" to reduce speed or thrust), a reference voltage Vref is generated by the variable resistor 1104 that is commensurate with the amount of deceleration desired. A greater deceleration results in a higher value for the reference voltage Vref, which is input to the negative terminal of the speed comparator circuit 1102.

The difference between the value of Vref and that of $V_{speed}$ is output as the input signal 101 to the signal amplifying system 100 of the present invention, with the output signal 12 coupled with a load 130, in this case, a power source for recharging. The biased comparator circuit 1102 outputs the input signal 101 only if the $V_{speed}$ is greater than Vref. That is, when the transportation system decelerates due to the easing of the acceleration unit, the value of $V_{speed}$ gradually reduces, and eventually will reach that of Vref. In the interim, while the transportation system is reducing speed (and hence, requiring less energy), the difference between the speed at which the transportation system is moving (represented as the $V_{speed}$) and that which the transportation system will eventual reach (represented as the Vref) is translated by the speed comparator circuit into the input signal 101 for recharging a power source through the signal amplifying system 100 of the present invention.

Figure 12:
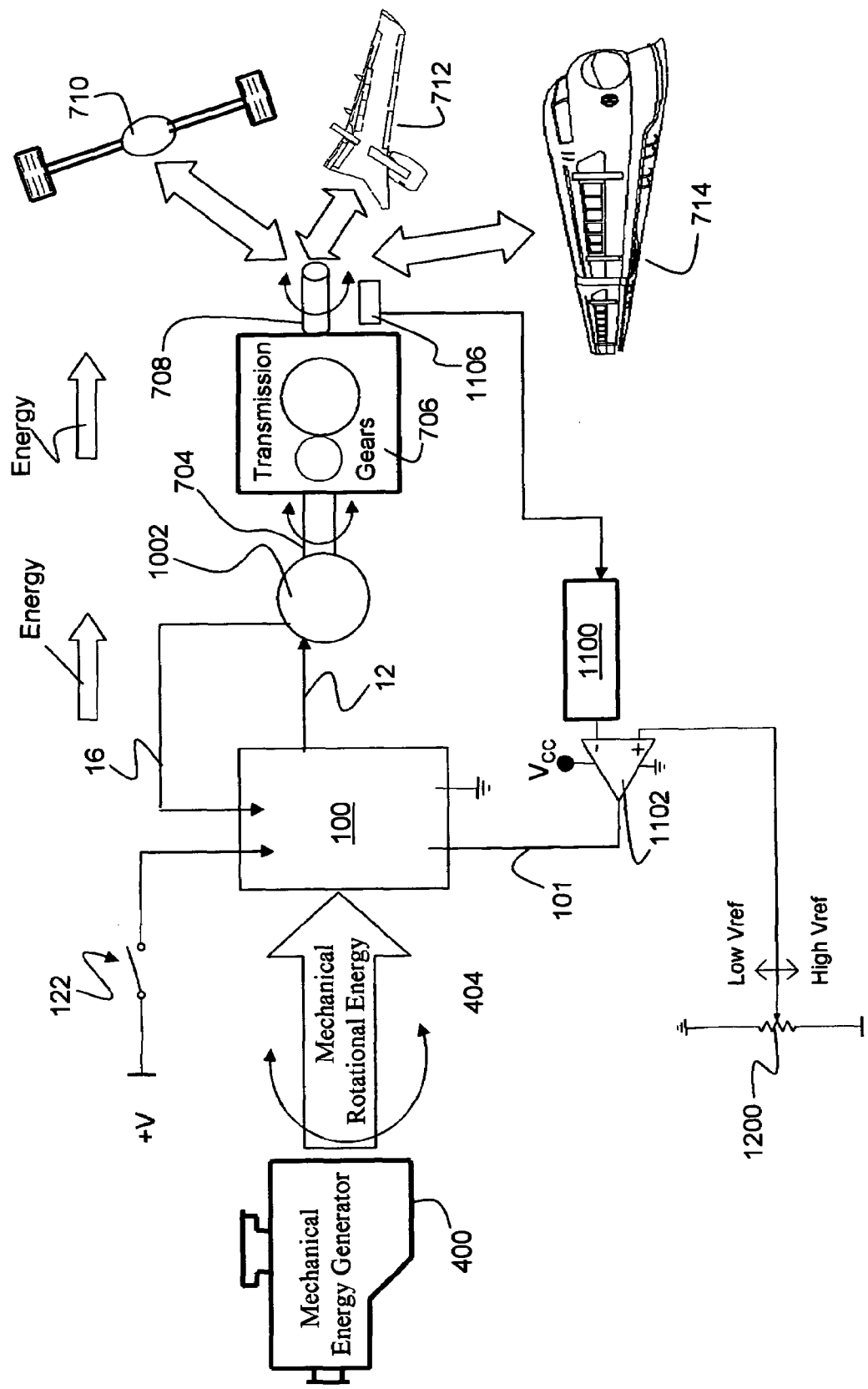
FIG. 12 is an exemplary illustration of the signal amplifying circuit of the present invention, used with an auto-drive unit of a transportation system in accordance with the present invention.

FIG. 12 is an exemplary illustration for the use of a cruse control (or auto-drive or autopilot controls) with the signal amplifying system 100 of the present invention, showing the direction of energy flows. For the sake of brevity, clarity, and convenience the general description of FIG. 12 will not repeat every corresponding or equivalent component that has already been described above in relation to FIGS. 1 to 11. As illustrated, setting an auto-drive unit (not shown) to set the velocity of a transportation system automatically sets the variable resistor 1200 to a certain reference voltage, Vref. If additional energy is needed to maintain the velocity of the transportation system at a certain speed (for example, when a car moves uphill it must be accelerated to maintain a pre-set auto-cruse speed), the scenario for energy transfer will be similar to that illustrated in FIG. 9 and shown in FIG. 12. That is, the difference between the increased acceleration and the instantaneous motion of the vehicle (until the velocity of the instantaneous motion equals with the desired acceleration amount) will be detected by the speed sensor 1106, and input to the negative terminal of the comparator circuit 1102 as the $V_{speed}$ 1100. The difference between the $V_{speed}$ 1100 and that of Vref is used by the comparator circuit 1102 to generate an input signal 101 to be fed to the signal amplifying system 100 for augmentation of energy to move the transportation system. If the transportation system requires deceleration by the easing of the acceleration unit (e.g., pulling back of the "throttle" to reduce speed or thrust to maintain a pre-set auto-curse or auto-pilot speed), the scenario for energy transfer will be similar to that described for and illustrated in FIG. 11. That is, the auto-derive unit will reduce the acceleration unit 718 to decelerate the transportation system to maintain the speed of the transportation system at a preset level, set by the auto-derive. This is similar to removing the "foot from the gas pedal to slow a car" to maintain a preset speed during downhill, when the car is on cruse control. Therefore, the different between the reduced acceleration and the instantaneous motion of the vehicle will be detected by the speed sensor 1106 and used to generate an input signal 101 by the speed comparator circuit 1102 to be fed to the signal amplifying system 100 for transfer of energy to load 130 (in this instance, for recharging or storing of electrical energy, illustrated in FIG. 11). Accordingly, FIG. 12 uses an auto-derive unit (such as a cruse control) with the signal amplifying system 100 of the present invention, which combines the systems of FIG. 9 and FIG. 11 to maintain the velocity of the vehicle at a certain level of speed, and to transfer energy to the appropriate load.

As has been described above, FIGS. 7, and 9 to 12 illustrate the use of the signal amplifying system 100 of the present invention in connection with the use of acceleration or deceleration of the transportation systems for transfer or conservation of energy to the appropriate load (power source, derive systems, etc.). Comparing FIGS. 7, and 9 to 12, it will be readily apparent to those skilled in the art that any well known switch system (including a software implementation thereof) may be used to switch the output signal 12 of the signal amplifying system 100 to either use the amplified signal for the transportation systems (energy usage), or use the amplified signal for conservation of energy (e.g., by recharging a power source). For example, the switching system may include sensor switches that detect the actuation of the deceleration unit 716 or the acceleration unit 718, and switch the output signal 12 to the appropriate load, accordingly.

Further more, it should be readily apparent to those skilled in the art that the deceleration unit 716 illustrated in FIG. 10 with the use of a variable resistor 1000 can be implemented within the systems illustrated in both FIGS. 7, 9, 11, and 12. In addition, FIG. 11 illustrates a scenario wherein the transportation system is in motion, and the transportation system is accelerated or decelerated without using the deceleration unit 716 (without the application of breaks to slow down). It should also be readily apparent to those skilled in the art that the system illustrated in FIG. 11 may easily be combined with those of FIGS. 7, 9, 10, and 12. Give that most of today's transportation systems have some type of auto-derive (e.g., a cruse control for cars, an auto-derive for electrical trains, or an autopilot for aircraft), it should also be readily apparent to those skilled in the art that the system illustrated in FIG. 12 may also be easily combined with those of FIGS. 7, and 9 to 11.

Therefore, FIGS. 7, 9 to 12, and their respective descriptions can be combined and be described and illustrated as a single system, but they are described and illustrated separately for clarity to facilitate understanding of the present invention, in particular, to facilitate understanding for the direction of energy flows. It should further be noted that switch 500 illustrated in any of the FIGS. 7, and 9 to 12 may continue to also function as a shut-off switch in cases where both the acceleration and the deceleration units are actuated simultaneously, redirecting input signal 101 from the acceleration units to the ground.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. For example, instead of the illustrated Metal Oxide Semiconductor Field Effect Transistors or the Bipolar Junction Transistors, other switching elements may be used, non-limiting examples of which may include Insulated Gate Bipolar Transistors (IGBTs), or any switching element, including mechanical switches, or any combination thereof. Such variations and alternate embodiments are contemplated, and can be made without departing from the spirit and scope of the invention.

What is claimed is:

1. A method for signal amplification, comprising the acts of:
   receiving a main input signal;
   comparing the main input signal with output feedback signals, and outputting a system input signal;
   modulating the system input signal for outputting a modulated signal;
   the act of modulating the system input signal is comprised of fill wave rectifying and modulating the system input signal;

coupling the modulated signal with a magnetic field generator winding of an electromagnetic device for generating a modulated magnetic field, which induces modulated electrical signals onto one or more electrical signal generator windings of the electromagnetic device;

rotating the electromagnetic device for amplifying the induced modulated electrical signals for outputting first amplified signals;

detecting polarity of the main input signal;

rectifying the first amplified signals in accordance with the detected polarity of the main input signal for output of second amplified signals;

recovering a main output signal by removing a modulated component of the second amplified signals for deriving a load and for providing feedback signal as the output feedback signals to a feedback circuitry.

2. The method for signal amplification as set forth in claim 1, wherein:

the act of receiving a main input signal is further comprised of an act of comparing the main input signal with the output feedback signals for detection and correction of overall system signal processes.

3. The method for signal amplification as set forth in claim 1, wherein:

the act of coupling the modulated signal with the magnetic field generator winding of the electromagnetic device is further comprised of providing a modulating switch.

4. The method for signal amplification as set forth in claim 1, wherein:

the act of detecting the polarity of the main input signal is further comprised of providing a polarity detector for determining the polarity of the main input signal.

5. The method for signal amplification as set forth in claim 1, wherein:

the act of rectifying the first amplified signals from a one or more electrical signal generator windings of the electromagnetic device in accordance with the detected polarity of the main input signal is comprised of:

rectifying the first amplified signals from the one or more electrical signal generator windings when a detected polarity of the main input signal is negative;

rectifying the first amplified signals from the one or more electrical signal generator windings when the detected polarity of the main input signal is positive.

6. The method for signal amplification as set forth in claim 1, wherein:

the act of recovering a main output signal for deriving the load is comprised of an act of demodulating the second amplified signals for removal of a modulation component.

7. The method for signal amplification as set forth in claim 6, wherein:

the act of demodulating is comprised of filtering the modulation component of the second amplified signals through a low pass filter for output of the main output signal for the load.

8. The method for signal amplification as set forth in claim 1, wherein:

the act of providing a feedback signal is comprised of providing output feedback signals for controlling the electrical parameters of the main output signal.

9. A system for signal amplification, comprising:

a main input signal coupled with a signal comparator circuit, with the signal comparator circuit producing a system input signal;

a modulator circuit for modulating the system input signal for generating a modulated signal;

the modulating circuit is comprised of a precision full wave rectifier coupled with a modulator for deriving a buffer switch for buffering and outputting the modulated signal that is coupled with the electromagnetic device;

an electromagnetic device having a magnetic field generator winding, with the modulated signal coupled with the magnetic field generator winding for generating a magnetic field, which induces modulated electrical signals onto one or more electrical signal generator windings of the electromagnetic device;

a mechanical energy generator for rotating the electromagnetic device for amplifying the induced modulated electrical signals for outputting first amplified signals;

a polarity detector circuit coupled with a comparator circuit for detecting the polarity of the main input signal;

a set of rectifying circuits for rectifying the first amplified signals in accordance with the detected polarity of the main input signal for outputting rectified signals;

a recovery circuit for filtering a high frequency component of the rectified signals for outputting a main output signal for deriving a load; and a feedback circuitry for correction of the main output signal in relation to the input signal.

10. The system for signal amplification as set forth in claim 9, wherein:

the signal comparator circuit is comprised of a comparator amplifier with an output coupled with a low-pass filter comprised of a resistor and a capacitor combination, which loop and feedback the system input signal to a negative input of the signal comparator circuit for controlling a bandwidth of the main output signal, and facilitating a control for a phase gain of system input signal.

11. The system for signal amplification as set forth in claim 9, wherein:

the buffer switch is comprised of a N channel MOSFET having a gate electrode coupled with the modulator, a source electrode coupled with a ground, and a drain electrode coupled with the electromagnetic device.

12. The system for signal amplification as set forth in claim 9, wherein:

a high impedance field bias resistor is coupled with the magnetic field generator winding at one end, and a ground at other end for biasing the set of rectifier circuits.

13. The system for signal amplification as set forth in claim 9, wherein:

the polarity detector is comprised of an amplifier that functions as a linear signal amplifier with a controlled gain for a first input level signal for reducing possible crossover distortions, and functions as a switching amplifier for a second input level signal.

14. The system for signal amplification as set forth in claim 9 further comprising:

a biasing scheme coupled with a first buffer-deriver and a second buffer-deriver for deriving and gating a first transistor and a second transistor that are coupled with the set of rectifier circuits, in accordance with a detected polarity of the system input signal by the polarity detector.

15. The system for signal amplification as set forth in claim 14, wherein:

the first transistor directing the set of rectifier circuits to rectify in one of a positive and negative polarity; and the second transistor directing the set of rectifier circuits to rectify in opposite polarity to that directed by the first transistor.

16. The system for signal amplification as set forth in claim 9, wherein:
the recovery circuit is comprised of a filter-demodulator that is comprised of an inductor coupled with a capacitor for forming a second order filter.

17. The system for signal amplification as set forth in claim 9, wherein:
the feedback circuit is comprised of a phase lag compensation to modify phases of the main output signal in relation to that of the rectified signal for avoiding oscillations.

18. The system for signal amplification as set forth in claim 9, wherein:
one or more parameters of the main input signal is varied by external systems before the main input signal is coupled with the signal comparator circuit.

19. The system for signal amplification as set forth in claim 18, wherein:
the external system is comprised of a programmable voltage regulator for deriving the load;
the programmable voltage regulator is comprised of:
a positive, negative, and neutral voltage references;
a first switching system having one end coupled with one of the positive, negative, and neutral voltage references for selecting one of the positive, negative, and neutral voltage references based on load requirements;
a variable impedance circuit coupled with the first switching system for varying one or more electrical parameters of the voltage references for outputting one of a positive, negative, and neutral variable signal as the main input signal;
a second switching system for disabling supply of the main input signal; and
a protection circuit having one end coupled with a second end of the first switching system, and another end coupled with the variable impedance circuit, with the protection circuit providing sufficient impedance to prevent the flow of the main input signal back to the voltage references when the second switching system is actuated for disabling supply of the main input signal.

20. The system for signal amplification as set forth in claim 19, wherein:
the variable impedance circuit is coupled with an acceleration unit of a transportation system.

21. The system for signal amplification as set forth in claim 19, wherein: the second switching system is coupled with a deceleration unit of a transportation system.

22. The system for signal amplification as set forth in claim 19, wherein:
the load is comprised of a drive unit for a transportation system.

23. The system for signal amplification as set forth in claim 19, wherein:
the load is a direct current load.

24. The system for signal amplification as set forth in claim 18, wherein:
the external system is comprised of a progranunable voltage regulator for deriving the load;
the programmable voltage regulator is comprised of:
an Alternative Current voltage source for generating an AC voltage reference;
a variable impedance circuit coupled with the Alternative Current voltage source for varying one or more electrical parameters of the AC voltage reference for outputting a variable signal as the main input signal;
a switching system for disabling supply of the main input signal; and
a protection circuit having one end coupled with the Alternative Current voltage source, and another end coupled with the variable impedance circuit, with the protection circuit providing sufficient impedance to prevent the flow of the main input signal back to the AC voltage reference when the switching system is actuated for disabling supply of the main input signal.

25. The system for signal amplification as set forth in claim 23, wherein:
the variable impedance circuit is coupled with an acceleration unit of a transportation system.

26. The system for signal amplification as set forth in claim 23, wherein:
the switching system is coupled with a deceleration unit of a transportation system.

27. The system for signal amplification as set forth in claim 23, wherein:
the load is comprised of a drive unit for a transportation system.

28. The system for signal amplification as set forth in claim 23, wherein:
the load is an Alternative Current load.

29. The system for signal amplification as set forth in claim 18, wherein:
the external system is comprised of a variable impedance circuit coupled with a deceleration unit of a transportation system;
the variable impedance circuit generating a variable voltage reference as the main input signal when the deceleration unit is actuated.

30. The system for signal amplification as set forth in claim 18, wherein:
the external system is comprised of a variable impedance circuit coupled with an acceleration unit of a transportation system;
the variable impedance circuit generating a variable voltage reference as the main input signal when the acceleration unit is actuated.

31. The system for signal amplification as set forth in claim 30, wherein:
the acceleration unit further includes an auto-derive system for the transportation system.

* * * * *